(12) United States Patent
Masuda

(10) Patent No.: US 10,816,615 B2
(45) Date of Patent: Oct. 27, 2020

(54) MAGNETIC SENSOR

(71) Applicant: ASAHI KASEI MICRODEVICES CORPORATION, Tokyo (JP)

(72) Inventor: Masanori Masuda, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 230 days.

(21) Appl. No.: 15/982,355

(22) Filed: May 17, 2018

(65) Prior Publication Data

US 2018/0335485 A1 Nov. 22, 2018

(30) Foreign Application Priority Data

| May 19, 2017 | (JP) | 2017-099774 |
| Jun. 8, 2017 | (JP) | 2017-113548 |
| Jul. 6, 2017 | (JP) | 2017-132763 |
| May 11, 2018 | (JP) | 2018-092421 |

(51) Int. Cl.
*G01R 33/00* (2006.01)
*G01R 33/09* (2006.01)
*G01R 33/02* (2006.01)

(52) U.S. Cl.
CPC ....... *G01R 33/093* (2013.01); *G01R 33/0005* (2013.01); *G01R 33/0011* (2013.01); *G01R 33/0206* (2013.01); *G01R 33/091* (2013.01); *G01R 33/098* (2013.01)

(58) Field of Classification Search
CPC .............. G01R 33/093; G01R 33/0005; G01R 33/0011

USPC ......................................................... 324/252
See application file for complete search history.

(56) References Cited

U.S. PATENT DOCUMENTS

| 5,904,996 A * | 5/1999 | Van Der Zaag ....... B82Y 25/00 |
| | | 204/192.15 |
| 5,952,825 A | 9/1999 | Wan |
| 6,124,711 A | 9/2000 | Tanaka et al. |
| 7,248,449 B1 * | 7/2007 | Seagle .................. B82Y 10/00 |
| | | 360/324.2 |
| 2004/0239320 A1 | 12/2004 | Kobayashi et al. |
| 2011/0175606 A1 | 7/2011 | Koyama et al. |
| 2011/0309829 A1 | 12/2011 | Loreit et al. |
| 2015/0177337 A1 | 6/2015 | Yamashita et al. |
| 2016/0109534 A1 | 4/2016 | Dieny et al. |
| 2016/0116283 A1 | 4/2016 | Deak et al. |

(Continued)

FOREIGN PATENT DOCUMENTS

| JP | S59-195889 A | 11/1984 |
| JP | H9-199769 A | 7/1997 |
| JP | 2002-175610 A | 6/2002 |

(Continued)

*Primary Examiner* — Reena Aurora
(74) *Attorney, Agent, or Firm* — Morgan, Lewis & Bockius LLP

(57) ABSTRACT

To more improve detection accuracy of a magnetic sensor. A magnetic sensor includes a substrate; an element part in which a free layer, a non-magnetic layer, and a pinned layer are stacked on the substrate; and a magnetic flux concentrator, wherein an area of the free layer is larger than an area of the pinned layer in a top view, and the free layer and the magnetic flux concentrator have a first overlap region in which the free layer and the magnetic flux concentrator at least partially overlap in the top view.

20 Claims, 14 Drawing Sheets

(56) References Cited

U.S. PATENT DOCUMENTS

2016/0238670 A1    8/2016   Shikama et al.
2017/0178781 A1    6/2017   O'Donnell et al.

FOREIGN PATENT DOCUMENTS

| | | |
|---|---|---|
| JP | 2004-356338 A | 12/2004 |
| JP | 2005-221383 A | 8/2005 |
| JP | 2007-093328 A | 4/2007 |
| JP | 2011-149825 A | 8/2011 |
| JP | 5044070 B2 | 7/2012 |
| JP | 2013-105825 A | 5/2013 |
| JP | 2014-182096 A | 9/2014 |
| JP | 2015-212713 A | 11/2015 |
| JP | 2016-521845 A | 7/2016 |
| JP | 2017-040628 A | 2/2017 |
| JP | 2017-111148 A | 6/2017 |
| WO | 2005/064357 A2 | 7/2005 |
| WO | 2015/052891 A1 | 4/2015 |
| WO | 2016/010120 A1 | 1/2016 |

* cited by examiner

MAGNETOSENSITIVE AXIS

MAGNETOSENSITIVE AXIS

MAGNETOSENSITIVE AXIS

OVERLAP WIDTH (WP) ON ONE SIDE BETWEEN MAGNETIC MATERIAL 21' AND MAGNETIC MATERIAL 30' [um]

RATIO OF AREA Q TO MAGNETOSENSITIVE AREA 23' $Q/S_{23}$

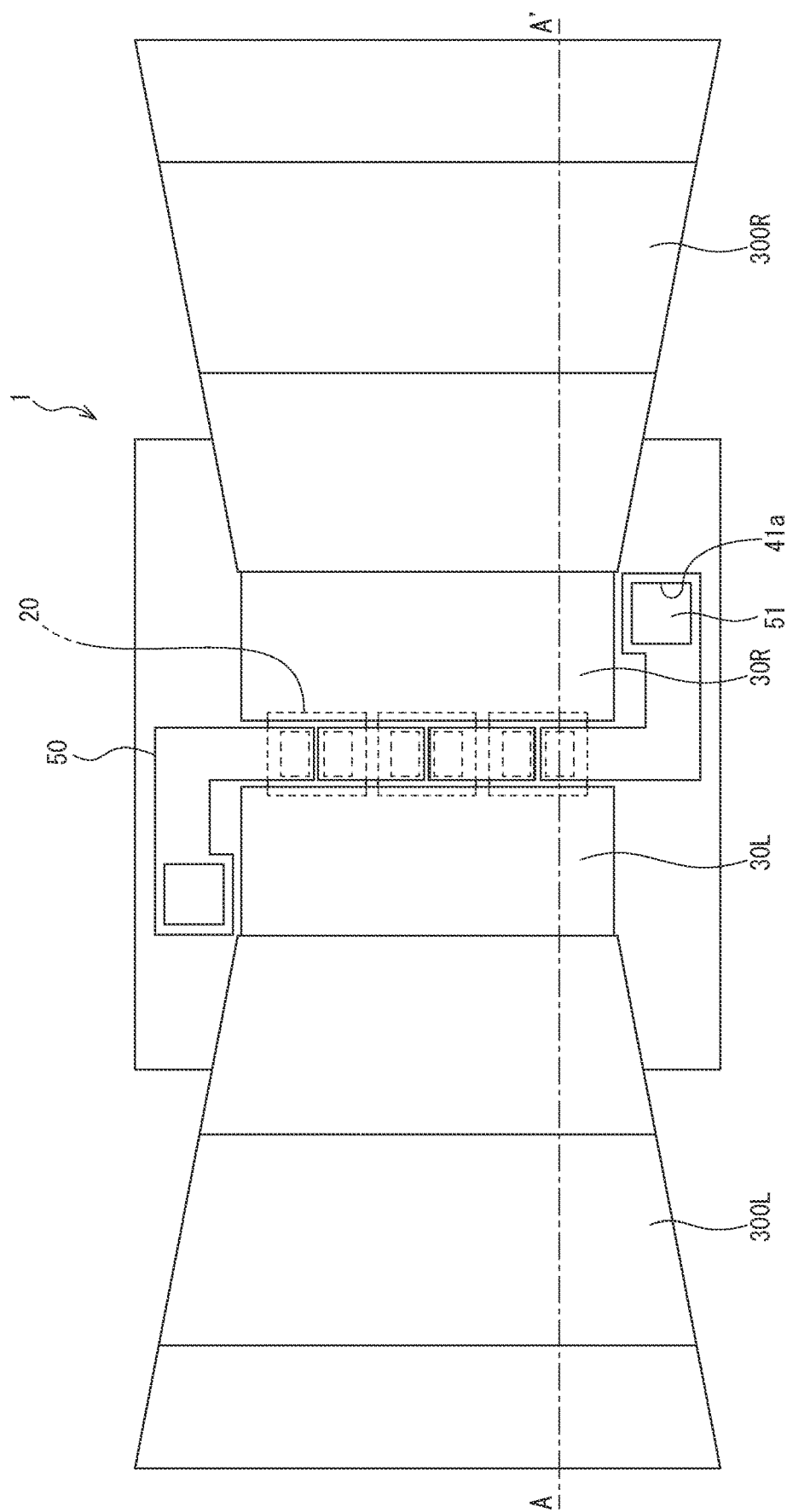

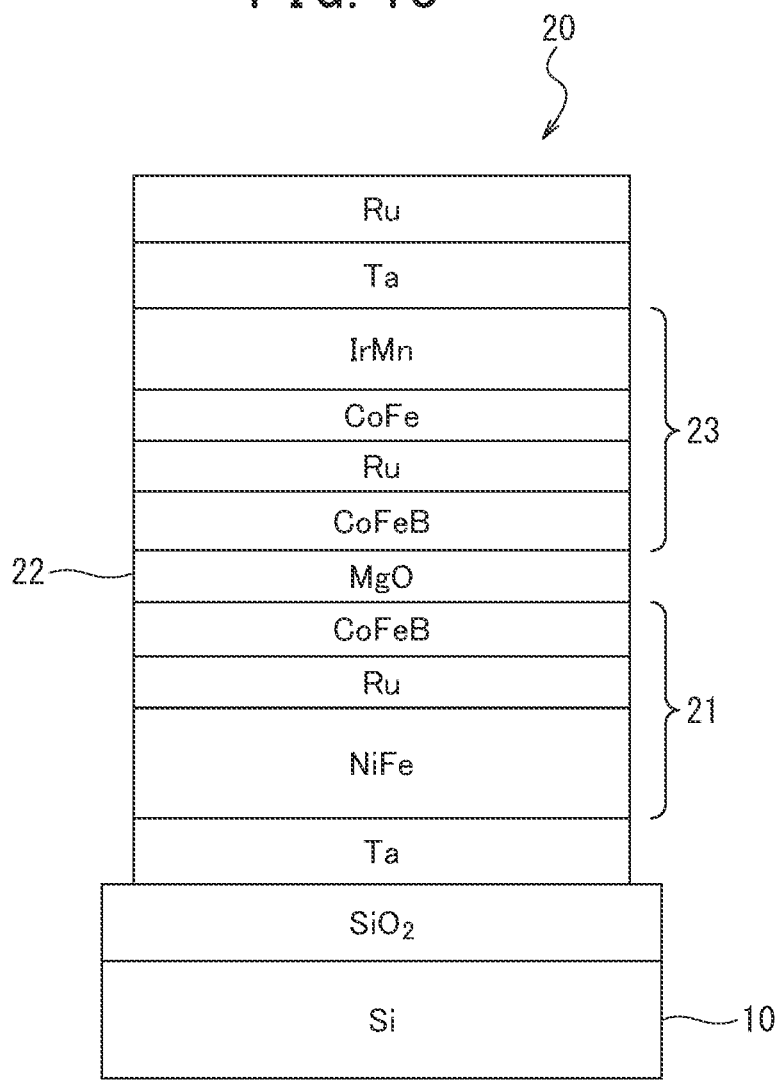

MAGNETIC SENSOR

CROSS REFERENCE TO RELATED APPLICATIONS AND INCORPORATION BY REFERENCE

This application claims benefit of priority under 35 USC 119 based on Japanese Patent Application No. 2017-099774 filed on May 19, 2017, Japanese Patent Application No. 2017-113548 filed on Jun. 8, 2017, Japanese Patent Application No. 2017-132763 filed on Jul. 6, 2017, and Japanese Patent Application No. 2018-92421 filed on May 11, 2018, the entire contents of which are incorporated by reference herein.

TECHNICAL FIELD

The present invention relates to a magnetic sensor.

BACKGROUND ART

There is a spin-valve MR magnetic sensor using a GMR (Giant Magneto Resistance) effect or a TMR (Tunnel Magneto Resistance) effect, as a magnetic sensor that detects a magnetic field.

The spin-valve MR magnetic sensor has a structure in which a non-magnetic layer is sandwiched between ferromagnetic layers (ferromagnetic layer/non-magnetic layer/ferromagnetic layer), and has a structure in which magnetization of one magnetic layer is fixed by an antiferromagnetic layer (pinned layer) and magnetization of the other ferromagnetic layer (free layer) can freely rotate with applied external magnetic field (spin-valve structure). When an external magnetic field H is applied to change a relative angle between the direction of magnetization of the pinned layer and the direction of magnetization of the free layer, a current flowing in the intermediate layer that is the non-magnetic layer is changed, and thus, the spin-valve MR magnetic sensor can detect a magnetic field (for example, refer to JP H09-199769 A).

It is known that the spin-valve MR magnetic sensor exhibits a large magneto resistance (MR) change by small magnetic field and is mainly used for a magnetic head of a hard disk, or the like. It is also known that the spin-valve MR magnetic sensor has higher sensitivity compared to a magnetic sensor using a hall effect, in other words, can detect a small magnetic field (for example, refer to JP 2005-221383 A).

The MR sensor has another type, and there is an AMR magnetic sensor using an AMR (Anisotropic Magneto Resistance) effect, for example. The AMR magnetic sensor has smaller sensitivity compared to a GMR magnetic sensor and a TMR magnetic sensor but excels in noise characteristics, and the magnetism detectability is at the equivalent level compared to the GMR magnetic sensor and the TMR magnetic sensor (for example, refer to JP 5044070 B2).

SUMMARY

According to an aspect of the present invention, there is provided a magnetic sensor including a substrate; an element part in which a free layer, a non-magnetic layer, and a pinned layer are stacked on the substrate; and a magnetic flux concentrator, wherein an area of the free layer is larger than an area of the pinned layer in a top view, and the free layer and the magnetic flux concentrator have a first overlap region in which the free layer and the magnetic flux concentrator at least partially overlap in the top view.

BRIEF DESCRIPTION OF DRAWINGS

FIG. 12A is a plan view of still another example of a magnetic sensor according to one embodiment of the present invention;

FIG. 13 is a view illustrating a layer structure of the element part; and

DETAILED DESCRIPTION

Figure 1A:
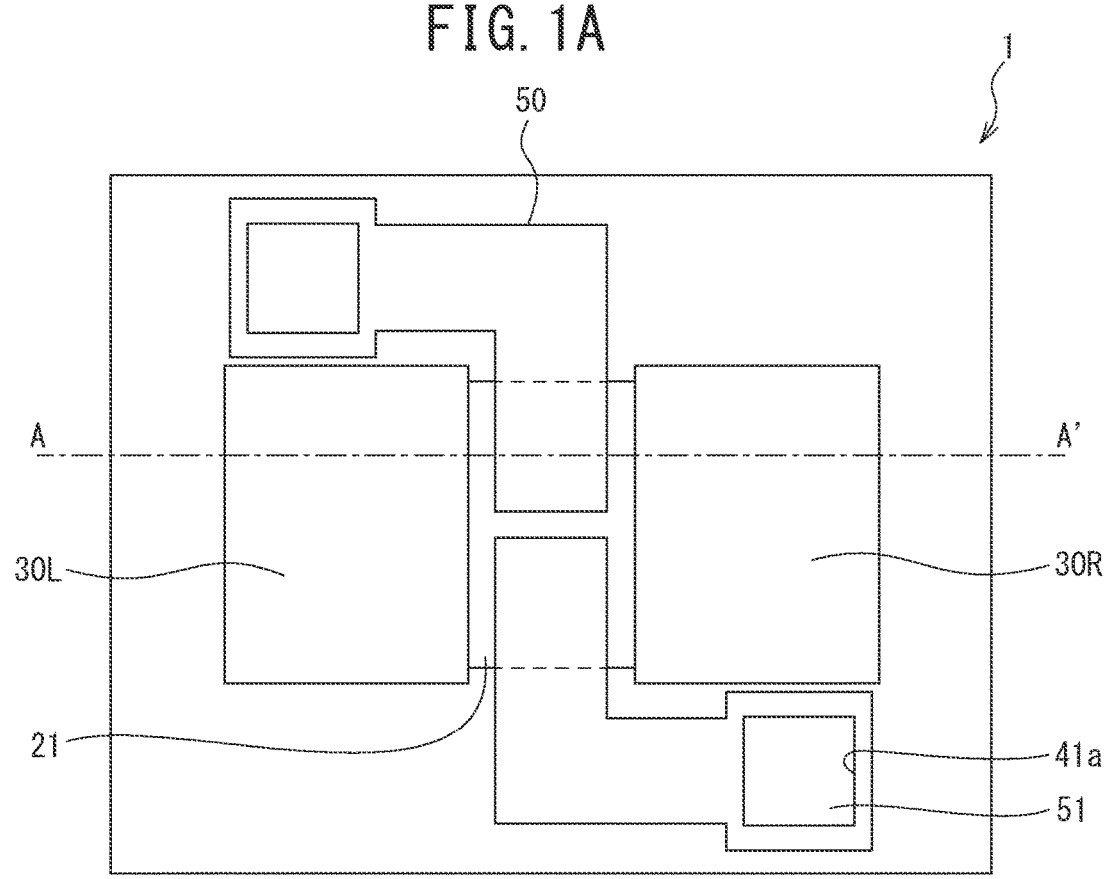
FIGS. 1A and 1B are schematic configuration diagrams illustrating an example of a magnetic sensor according to one embodiment of the present invention.

The above-described spin-valve MR magnetic sensor using a GMR effect or a TMR effect has a feature of having higher magnetic sensitivity compared to a hall element and an AMR element. However, the sensitivity is insufficient for obtaining a very small magnetic field, such as a magnetic field generated from a human body.

Embodiments described below have been made in view of such circumstances, and an object of the embodiments invention is to provide a magnetic sensor capable of more improving detection accuracy.

In the following detailed description, a number of particular specific configurations will be described for providing complete understanding of embodiments of the present invention. However, it is clear that other embodiments are practicable without limiting to such particular specific configurations. In addition, the following embodiments do not limit the invention according to claims but include all combinations of characteristic configurations described in the embodiments.

Hereinafter, one embodiment of the present invention will be described with reference to the drawings. In the following description of the drawings, the same portions are denoted by the same reference numerals. However, the drawings are schematic, and a relationship between a thickness and a flat dimension, a ratio of thicknesses of respective layers, and the like are different from actual ones.

<Magnetic Sensor>

A magnetic sensor according to one embodiment of the present invention includes a substrate, an element part in which a free layer, a non-magnetic layer, and a pinned layer are stacked on the substrate, and a magnetic flux concentrator, and is configured such that the area of the free layer is larger than the area of the pinned layer in a top view, and the free layer and the magnetic flux concentrator have a first overlap region in which the free layer and the magnetic flux concentrator at least partially overlap in the top view.

In addition, in the element part, it is preferable that the free layer, the non-magnetic layer, and the pinned layer be stacked on the substrate in this order from the viewpoint of simplicity of easiness of device fabrication process.

(Magnetosensitive Axis)

In the present invention, a direction in which the magnetic sensor detects a magnetic field will be referred to as a "magnetosensitive axis". When the direction of the magnetosensitive axis of the magnetic sensor is parallel to the direction of a magnetic field that is an object to be measured, the sensitivity for detecting the magnetic field is the best. When the direction of the magnetosensitive axis is perpendicular to the direction of the magnetic field, desirably, the magnetic sensor does not detect the magnetic field, and there is no output fluctuation, but a change may occur.

(Overlap Region P)

The magnetic sensor according to the present invention has a part in which a part of the free layer and at least a part of the magnetic flux concentrator overlap in the top view. In the present invention, this is defined as an "overlap region P".

Figure 1B:
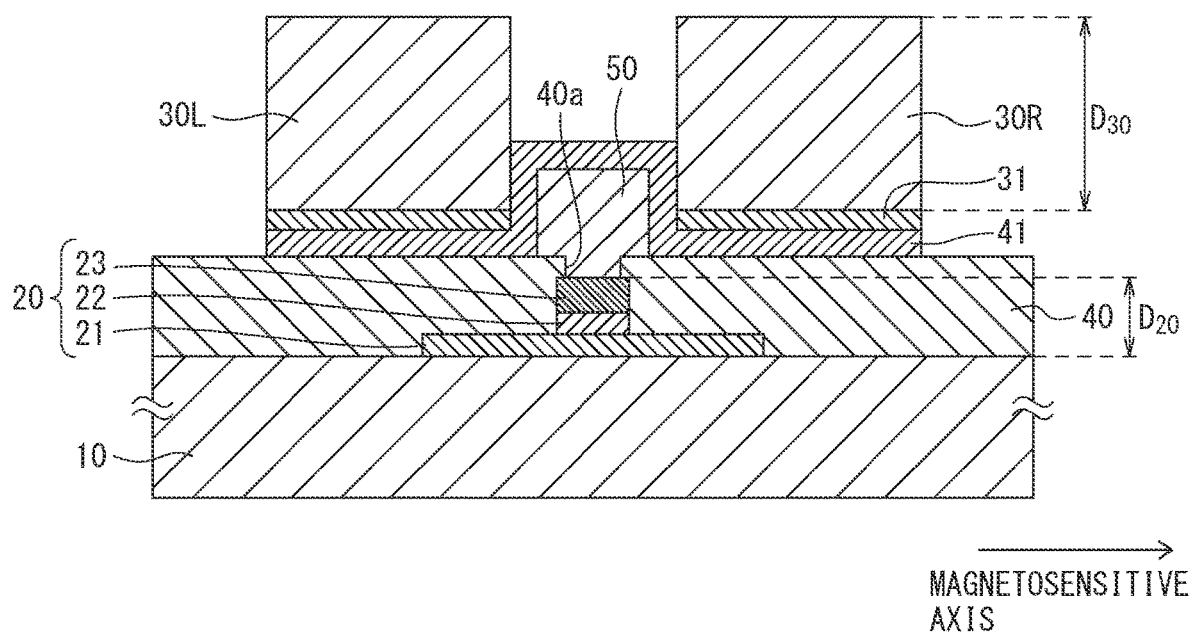

The overlap region (first overlap region) P indicates that a part of the free layer and at least a part of the magnetic flux concentrator overlap in the top view, and the magnetic flux concentrator 30 (30L, 30R) is not in contact with the free layer 21 when viewing a cross section of the overlap region P, as illustrated in FIG. 1B described below.

Figure 10A:
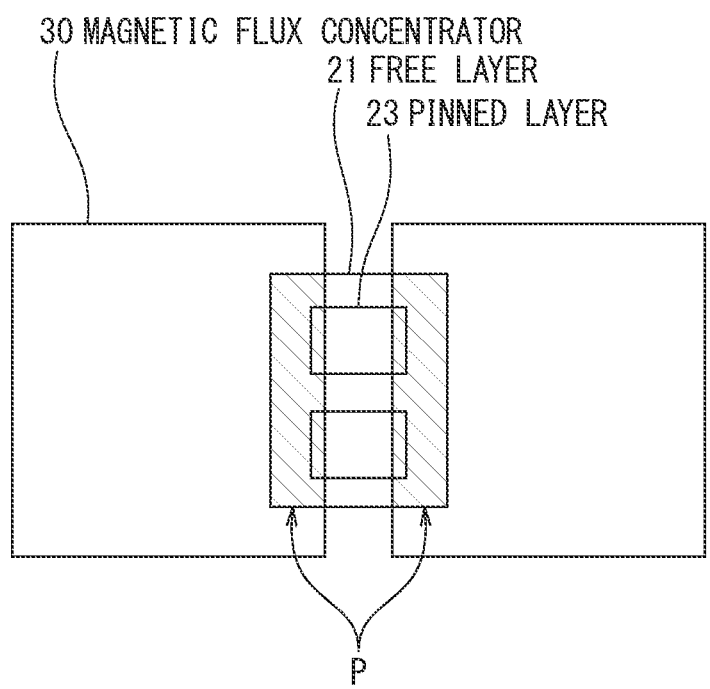
FIGS. 10A and 10B are schematic diagrams illustrating overlap parts.
Figure 10B:
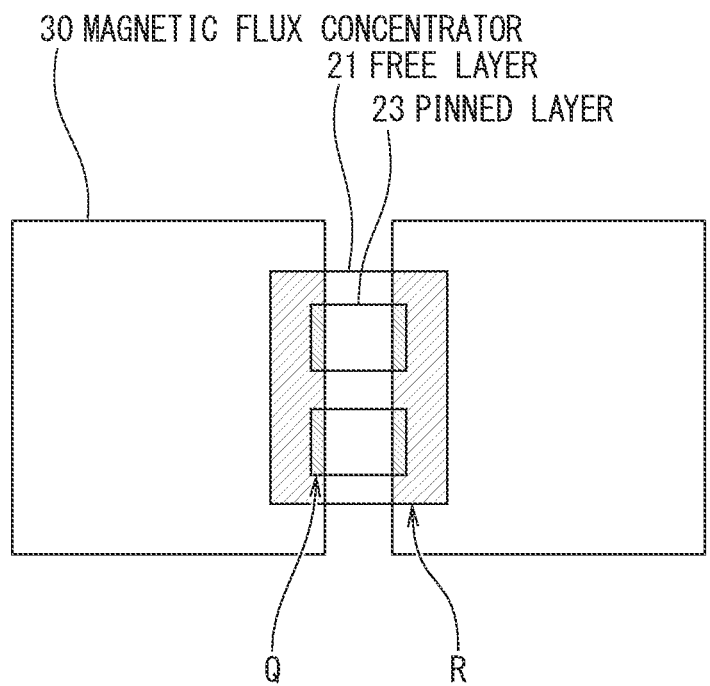

FIGS. 10A and 10B are schematic diagrams illustrating the overlap region P and overlap parts Q and R defined below. As illustrated in FIG. 10A, the overlap region P is a part in which the free layer 21 and the magnetic flux concentrator 30 overlap, and corresponds to the sum of the overlap part Q and the overlap part R.

(Overlap Part Q)

The magnetic sensor according to the present invention may have or may not have a part in which a part of the pinned layer 23 and at least a part of the magnetic flux concentrator 30 overlap in the top view. In the present invention, as illustrated in FIG. 10B, the "overlap part Q" is defined as a part (second overlap region) of the overlap region P overlaps with the pinned layer 23.

From the viewpoint of improving magnetic sensitivity, the ratio of the overlap part Q to the pinned layer 23 in the top view is desirably ⅜ or less, more desirably ⅔ or less, more desirably ⅛ or less, and more desirably Q=0.

(Overlap Part R)

As illustrated in FIGS. 10A and 10B, a part except the overlap part Q of the overlap region P is defined as the "overlap part R".

From the viewpoint of improving magnetic sensitivity, in the magnetic sensor according to the present invention, desirably, the area of the overlap part Q is smaller than the area of the overlap part R.

Either the magnetic flux concentrator or the free layer may be located on the upper side. Generally, from the viewpoint of simplicity of manufacturing elements, a protection layer is deposited after the element part is manufactured, and the magnetic flux concentrator is fabricated thereon, and thus, the magnetic flux concentrator is located above the free layer. The magnetic flux concentrator can be located on the lower side, by forming an insulation layer made of $SiO_2$ or the like on the whole surface of the substrate after the magnetic flux concentrator is manufactured and forming the element part after polishing is performed such that the top surface has the same height. In addition, an insulation layer composed of, for example, $SiO_2$ or SiN may be provided between the magnetic flux concentrator and the free layer. An insulation layer composed of another substance can be applied without limiting to $SiO_2$ or SiN.

Next, respective components of the magnetic sensor according to one embodiment of the present invention will be described with examples.

(1) Free Layer

The free layer in the magnetic sensor according to one embodiment of the present invention is mainly composed of a ferromagnetic material that is easily magnetized by an external magnetic field. The free layer may be a multi-layer structure without limiting to when being composed of one material. Any one of NiFe, CoFeB, CoFeSiB, CoFe, NiFeSiB, and the like can be used as the ferromagnetic material, although not limited thereto. Preferably, the free layer is a multi-layer film in which a non-magnetic layer made of Ru, Ta, or the like is inserted into the free layer for improving magnetic sensitivity. It is to be noted that the microfabrication shape of the free layer does not matter.

In order to obtain excellent magnetic characteristics, a stacked layer in which NiFe (a first ferromagnetic layer), Ru (a first magnetic coupling layer), and CoFeB (a second ferromagnetic layer) are stacked in this order is preferable as the free layer.

(2) Non-Magnetic Layer

The non-magnetic layer in the magnetic sensor according to one embodiment of the present invention is composed of an insulating non-magnetic material. Generally, an insulating material, such as $Al_2O_3$, MgO, or the like, can be used in the case of a TMR element, although not limited thereto. Preferably, MgO is used for the non-magnetic layer for heightening magnetic sensitivity. It is to be noted that the microfabrication shape of the non-magnetic layer does not matter.

In addition, a non-magnetic layer in a magnetic sensor according to another embodiment of the present invention may not be insulating. Cu, Ag, Au, or the like can be used as a non-insulating non-magnetic material, although not limited thereto.

(3) Pinned Layer

The pinned layer in the magnetic sensor according to one embodiment of the present invention is composed by mainly using a ferromagnetic material such that a magnetization direction is not easily changed by an external magnetic field. The pinned layer may be a multi-layer structure without limiting to when being composed of one material. As an example, a structure in which the ferromagnetic material is pinned with an antiferromagnetic material is used for the pinned layer. Any one of NiFe, CoFeB, CoFeSiB, CoFe, and the like can be used as the ferromagnetic material, although not limited thereto. A multi-layer structure in which a non-magnetic layer made of Ru, Ta, or the like is inserted into the pinned layer is preferable for improving magnetic sensitivity. In addition, IrMn, PtMn, or the like can be used as the antiferromagnetic material, but the present invention is not limited to the configuration. It is to be noted that the microfabrication shape of the pinned layer does not matter.

In order to obtain excellent magnetic characteristics, a stacked layer in which CoFeB (a third ferromagnetic layer), Ru (a second magnetic coupling layer), CoFeB (a fourth ferromagnetic layer), and IrMn (a first antiferromagnetic layer) are stacked in this order is preferable as the pinned layer.

When a magnetic field is externally applied, magnetization distribution that peaks on a line segment through the gravity center of the free layer and perpendicular to the magnetosensitive axis of the element part exists in the plane of the free layer. Since an element having higher sensitivity can be obtained when the change of magnetization is larger with respect to an external magnetic field, in order to manufacture an element having higher sensitivity, preferably, at least a part of the pinned layer is arranged on the line segment through the gravity center of the free layer and perpendicular to the magnetosensitive axis of the element part in the top view, as illustrated in FIGS. 1A and 1B described below.

(4) Element Part

The element part in the magnetic sensor according to one embodiment of the present invention includes the free layer, the pinned layer in which magnetization is fixed in a first direction, and the non-magnetic layer arranged between the free layer and the pinned layer, and is stacked in order of the free layer, the non-magnetic layer, and the pinned layer. The element part may be stacked in order of the free layer, the non-magnetic layer, and the pinned layer, or in contrast, may be stacked in order of the pinned layer, the non-magnetic layer, and the free layer on the substrate.

From the viewpoint of simplicity of a device fabrication process, since etching is performed from above, it is preferable that the area of either one of the free layer and the pinned layer that is located on the substrate side be larger than that of the other in the top view. In addition, from the viewpoint of improving magnetic sensitivity, desirably, the area of the free layer is large. When considering the area efficiency of the entire element in view of the above two points, desirably, the free layer is formed on the substrate side compared to the pinned layer, and the pinned layer is formed on a part of the free layer. In other words, desirably, the pinned layer is included in the free layer in the top view. More specifically, the area of the free layer is larger than the area of the pinned layer.

Another layer may be inserted above or below the above three layers (the pinned layer, the free layer, and the non-magnetic layer) or between the three layers.

From the viewpoint of antioxidation, preferably, a non-magnetic cap layer is included on the top of the element part. From the viewpoint of connection with a wiring part, preferably, the non-magnetic cap layer is made of a conductive material, such as Au, Ru, or the like.

From the viewpoint of adhesion, desirably, a metal layer made of Ti, Ta, or the like is included between the substrate and the free layer (or the pinned layer). The element part can be formed by a publicly known method, and can be formed by a sputtering method, as an example. In addition, when a plurality of element parts are formed, the plurality of element parts can be formed by performing dry etching or wet etching on the stacked layer formed on the substrate, in which at least the free layer, the non-magnetic layer, and the pinned layer are stacked in this order or in reverse order, using a photoresist pattern formed by a photolithography method.

At this time, the shape of the element parts may be controlled by stopping the etching in the middle of the element parts. In this case, an upper layer above the etching stop point may be formed to be divided into a plurality of parts on a lower layer below the etching stop point.

In addition, the etching stop point may be arbitrarily set. For example, the pinned layer (or the free layer) and a part of the non-magnetic layer may be included in the upper layer, and a part of the non-magnetic layer and the free layer (or the pinned layer) may be included in the lower layer. In addition, the free layer, the non-magnetic layer, and the pinned layer may be included in the upper layer, and the lower layer may be composed of a layer other than them (for example, Ta, Ru, or the like).

In order to determine a magnetization easy axis of the stacked layer, a magnetic field may be applied during deposition parallel to a direction to be the magnetization easy axis.

Here, the magnetization easy axis means an easily-magnetized direction by characteristics of magnetic anisotropy of a magnetic material. The magnetic anisotropy is determined by some type of anisotropies. The some type of anisotropies are shape magnetic anisotropy determined by the shape of a magnetic material, magnetocrystalline anisotropy determined by crystal orientation, induced magnetic anisotropy caused by arrangement of magnetic atoms, and the like.

In addition, the magnetization easy axis may be determined by performing heat treatment in the magnetic field after depositing the stacked layer.

In addition, the magnetization easy axis may be determined by processing the free layer to have an elongate shape in the top view.

In addition, in order to equalize magnetic flux density that flows into the element parts, preferably, the length of the element parts in a direction perpendicular to the magnetosensitive axis is shorter than the length of the magnetic flux concentrator in the direction perpendicular to the magnetosensitive axis in the top view.

In addition, from the viewpoint of reduction of noise of the magnetic sensor, desirably, the element parts are connected in parallel or in series. Furthermore, desirably, the element parts are connected in series for improving insulation breakdown resistance. In addition, desirably, the element parts are arranged along a side perpendicular to the magnetosensitive axis of the magnetic flux concentrator for effectively magnetic amplifying the entire element parts.

In addition, the free layer may be formed by stacking a first ferromagnetic layer, a first magnetic coupling layer, and a second ferromagnetic layer in this order. The pinned layer may be formed by stacking a third ferromagnetic layer, a second magnetic coupling layer, a fourth ferromagnetic layer, and a first antiferromagnetic layer in this order. The first and second magnetic coupling layer may be formed of a conductive and non-magnetic material. The thicknesses of the first and second magnetic coupling layer may be smaller than the thickness of any one of the first to fourth ferromagnetic layer. The second ferromagnetic layer and the third ferromagnetic layer may contain Co and Fe.

In addition, in order to obtain excellent magnetic characteristics, the thickness of the first ferromagnetic layer may be larger than the sum of the thicknesses of the second to fourth ferromagnetic layer.

(5) Magnetic Flux Concentrator

The magnetic flux concentrator in the magnetic sensor according to one embodiment of the present invention is composed of a soft magnetic material whose thickness direction is a magnetization hard axis direction. Examples of the soft magnetic material include NiFe, CoFeSiB, NiFe-CuMo, CoZrNb, and the like, although not limited thereto. The magnetic flux concentrator can be manufactured by a sputtering method or plating. More specifically, the magnetic flux concentrator can be formed by a publicly known method. As an example, the magnetic flux concentrator is formed by forming a seed layer using a material, such as Cu or NiFe, on the whole surface of a stacked part on which wirings and the like are formed, forming a photoresist pattern by a photolithography method, further forming a plating layer, and removing the photoresist pattern and the extra seed layer, or the magnetic flux concentrator can be formed by forming the magnetic flux concentrator by a vapor deposition method or a sputtering method, and further removing the photoresist pattern. Alternatively, the magnetic flux concentrator can also be formed by separately forming a soft magnetic material having a ribbon shape by cutting out, and attaching this close to the element part. The magnetic flux concentrator can also be formed by attaching a second soft magnetic material formed into a ribbon shape to a first soft magnetic material manufactured by plating or the like and combining them together. In order to suppress coercive force, regarding magnetic characteristics in the plane of the layer, desirably, a direction parallel to the magnetosensitive axis direction of the element part is an axis harder to be magnetized compared to the direction perpendicular to the magnetosensitive axis.

In addition, a magnetic flux concentrator in a magnetic sensor according to another embodiment of the present invention is configured to be electrically insulated from the element part. As the configuration for electrically insulating the magnetic flux concentrator and the element part, silicon oxide, silicon nitride, aluminum oxide, or the like used for the protection layer described below is formed between the magnetic flux concentrator and the element part, although not limited thereto.

Figure 11:
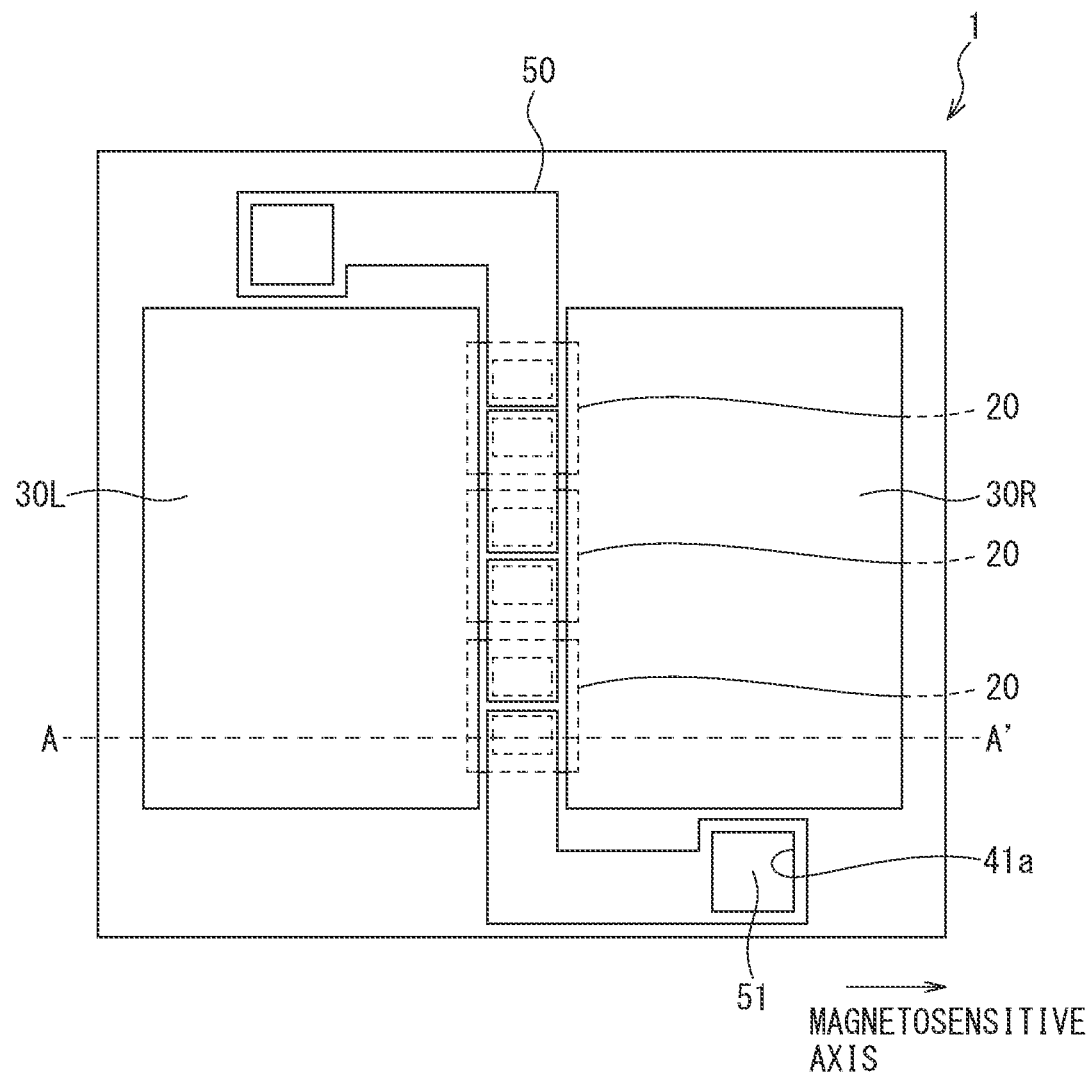
FIG. 11 is a schematic configuration diagram illustrating another example of a magnetic sensor according to one embodiment of the present invention.

Desirably, the element part is arranged as close as possible to a side of the magnetic flux concentrator in the top view in the direction perpendicular to the magnetosensitive axis direction of the element part, for effective magnetic amplification. Although one magnetic flux concentrator exerts an effect, desirably, at least two magnetic flux concentrators are arranged to sandwich the element part in the top view, for more effective magnetic amplification. Therefore, when there is a plurality of element parts 20 as illustrated in FIG. 11, desirably, the element parts 20 are arranged side by side in the direction substantially perpendicular to the magnetosensitive axis direction in the top view. It is to be noted that the same portions are denoted by the same reference numerals in FIGS. 1A, 1B, and FIG. 11, since the magnetic sensor illustrated in FIG. 11 is similar to the magnetic sensor illustrated in FIGS. 1A and 1B, except for slight differences in the dimensions of some parts and the number of the element units 20.

In addition, in order to prevent deterioration of device characteristics due to transmission of magnetic noise generated in the magnetic flux concentrator to the element part, desirably, the magnetic flux concentrator and the element part are insulated.

In addition, when the pinned layer and the magnetic flux concentrator overlap, the shape of the magnetic flux concentrator is changed in a reflection of unevenness of the element part. Thus, desirably, the pinned layer and the magnetic flux concentrator are arranged not so as to overlap. In addition, desirably, the magnetic flux concentrator has a rectangular shape for uniformly magnetic amplifying the element part.

In addition, in order for effectively magnetic amplifying, it is preferable that the thickness $D_{30}$ of the magnetic flux concentrator be larger than the thickness $D_{20}$ of the element part, as illustrated in FIG. 1B described below.

In order to make it possible to be fabricated by a simple process, it is preferable that the magnetic flux concentrator and the element part be arranged such that the top end of the element part is lower than the lower end of the magnetic flux concentrator in a side view, as illustrated in FIG. 1B.

Further, in order for effectively magnetic amplifying, as described in FIGS. 3A and 3B described below, it is preferable that the length of the magnetic flux concentrator in the direction substantially parallel to the magnetosensitive axis be longer than the length of the magnetic flux concentrator in the direction substantially perpendicular to the magnetosensitive axis by two or more times in the top view.

Figure 12B:
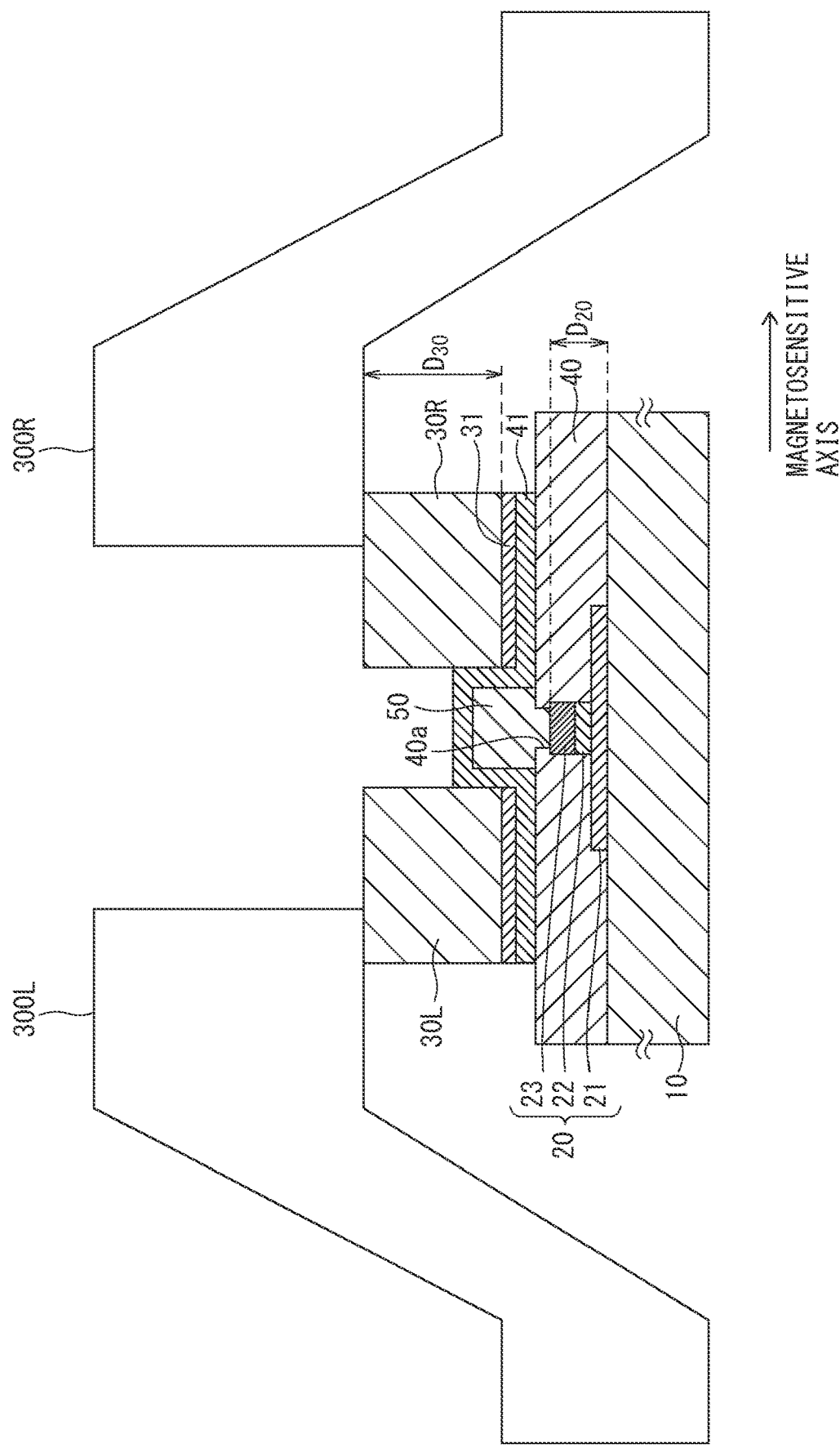
FIG. 12B is a cross sectional view of the magnetic sensor illustrated in FIG. 12A.

Further, in order to allow effectively magnetic amplifying by a simple process, as described in FIGS. 12A and 12B, the magnetic flux concentrator may include a first soft magnetic material formed on the substrate and a second soft magnetic material formed separately from the first soft magnetic material. For example, the second soft magnetic material may be separately formed in a ribbon shape by cutting out it from a soft magnetic material, and may be attached to the first soft magnetic material. It is to be noted that the same portions are denoted by the same reference numerals in FIGS. 11, 12A, and 12B, since the magnetic sensor illustrated in FIGS. 12A and 12B is similar to the magnetic sensor illustrated in FIG. 11, except for differences in the configuration of the magnetic flux concentrator.

In order to allow effectively magnetic amplifying by a simple process, at least a part of the magnetic flux concentrator may include a plating layer formed by a plating process.

(6) Protection Layer

The protection layer in the magnetic sensor according to one embodiment of the present invention is used for maintaining insulation from the element part, the wiring part, the magnetic flux concentrator, and the like. The material of the protection layer is not particularly limited as long as it can insulate the element part, the wiring part, the magnetic flux concentrator, and the like, and examples thereof include silicon oxide, silicon nitride, or aluminum oxide. The protection layer is formed so as to cover the entire surface of the element part, and an energization window (i.e. opening) exists in a joint part between the element part and the wiring part and a region corresponding to the upper part of electrodes or the like of the protection layer. The position and the shape of the energization window are not limited in the present invention.

(7) Wiring Part

The wiring part in the magnetic sensor according to one embodiment of the present invention connects the electrodes to the element part through the energization window formed on the protection layer (insulation layer). In addition, when a plurality of magnetic sensors are connected in series or in parallel, the wiring part is also used for electrically connecting the element parts. From the viewpoint of adhesion, desirably, a layer made of Ti, Ta, or the like is included between the cap layer (or the top layer of the element part) and the wiring part.

When the element parts are connected in series or in parallel and the plurality of magnetic sensors are connected in series or in parallel, from the viewpoint of performing effective magnetic amplification using the magnetic flux concentrator, preferably, the element parts are connected so as to extend in the direction substantially perpendicular to the magnetosensitive axis direction of the element parts in the top view.

The material of the wiring part is not particularly limited as long as it is a conductive material capable of electrically connecting the element parts or between the electrodes (for example, Au, Cu, Cr, Ni, Al, Ta, Ru, or the like). In addition, the wiring part may be composed of a single material or may be composed by mixing or stacking a plurality of materials. The wiring part can be formed by a publicly known method, and can be formed by forming a photoresist pattern by a photolithography method, forming a conductive material on the whole surface of the substrate including the photoresist pattern by a vapor deposition method or a sputtering method, and further peeling the photoresist pattern using a peeling liquid (i.e. liftoff method), as an example.

In addition, for the purpose of applying a bias magnetic field to the element parts, a wiring part that is not connected to the element parts may be separately provided.

(8) Electrode

The electrodes in the magnetic sensor according to one embodiment of the present invention are used for connection with an external circuit or the like. From the viewpoint of adhesion, when the electrodes are provided on the substrate or the element part, desirably, a layer made of Ti, Ta, or the like is included between the substrate and the electrodes. The element part may be left on the substrate, and the electrodes may be manufactured thereon. The material of the electrodes is not particularly limited as long as it is a conductive material (for example, Au, Cu, Cr, Ni, Al, Ta, Ru, or the like), similarly to the wiring part, and from the viewpoint of element characteristics, a material difficult to be oxidized (Au, Ru, or the like) is more preferable.

In addition, the electrodes may be composed of a single material or may be composed of a plurality of materials that are mixed or stacked. The electrodes can be formed by a publicly known method, and can be formed by forming a photoresist pattern by a photolithography method, further forming a conductive material on the whole surface of the stacked part including the photoresist pattern by a vapor deposition method or a sputtering method, and further peeling the photoresist pattern using a peeling liquid (i.e. liftoff method), as an example. From the viewpoint of the number of device fabrication processes, desirably, the electrodes are manufactured in the same process as the wiring part.

In addition, when the protection layer covers the wiring part and the electrodes, an electrode part has an energization window for electrical connection with the outside.

Specific Examples

Hereinafter, specific examples of the magnetic sensor according to one embodiment of the present invention will be described using the drawings. In addition, a comparison with conventional technologies is made, and superiority is indicated. It is to be noted that a part having the same configuration is denoted by the same reference numeral in each drawing described below, and the repetitive description thereof will be omitted.

Embodiments

Example of Configuration

FIGS. 1A and 1B are schematic diagrams illustrating an example of a configuration of a magnetic sensor 1 according to one embodiment of the present invention, in which FIG. 1A is a plan view, and FIG. 1B is a cross-sectional view of A-A' in FIG. 1A. It is to be noted that a border line inside the magnetic sensor 1, a part of which is not exposed to the outside, is also indicated by broken lines in FIG. 1A for clarifying the overlap between the respective layers.

The magnetic sensor 1 illustrated in FIGS. 1A and 1B includes a substrate 10, an element part 20 arranged on the substrate 10, a protection layer 40 that covers the element part 20, a wiring part 50 connected to the element part 20 through an opening 40a as an energization window formed in the protection layer 40, and a protection layer 41 that covers the wiring part 50 and the protection layer 40. Furthermore, the magnetic sensor 1 includes a magnetic flux concentrator 30 stacked on the protection layer 41 through a seed layer 31. An energization window 41a is formed in a part of the protection layer 41 that overlaps with the wiring part 50 in the top view, and a part in which the wiring part 50 is exposed forms an electrode 51.

The magnetic flux concentrator 30 includes a pair of magnetic flux concentrators 30L, 30R. The magnetic flux concentrators 30L, 30R are formed into rectangular shapes in the top view, and arranged such that a pair of opposite sides of each of the magnetic flux concentrators 30L, 30R is parallel to the magnetosensitive axis direction of the element part 20, the other pair of opposite sides of each of the magnetic flux concentrators 30L, 30R is parallel to each other, and the magnetic flux concentrators 30L, 30R sandwich the element part 20 from both sides thereof. In FIG. 1A, the magnetic flux concentrator on the left side of the element part 20 is illustrated as the magnetic flux concentrator 30L, and the magnetic flux concentrator on the right side is illustrated as the magnetic flux concentrator 30R. In addition, the magnetosensitive axis direction of the element part 20 is defined as a width direction of the magnetic sensor 1, i.e. a left-to-right direction in FIGS. 1A and 1B.

The element part 20 is configured by stacking a free layer 21, a non-magnetic layer 22, and a pinned layer 23 on the substrate 10 in this order.

Furthermore, as illustrated in FIGS. 1A and 1B, the magnetic sensor 1 according to one embodiment of the present invention is arranged such that a part of the free layer 21 and at least a part of the magnetic flux concentrator 30 overlap in the top view.

Example of Manufacturing Method

A manufacturing method of the magnetic sensor 1 according to a first embodiment of the present invention will be described. The manufacturing method described below is an example, and the magnetic sensor 1 needs not necessarily to be manufactured by the following method.

First, a stacked layer of a ferromagnetic layer, a non-magnetic layer, and a ferromagnetic layer to be the free layer 21, the non-magnetic layer 22, and the pinned layer 23 is alternately deposited on the substrate 10 by a publicly known method, such as a sputtering method. Next, a photoresist pattern is formed on the stacked layer by a photolithography method or the like. The photoresist pattern may be formed on the stacked layer at a desired position to have a desired shape.

Next, the stacked layer is etched by a publicly known method, such as an ion milling method, using the photoresist pattern as a mask. Consequently, the stacked layer on the substrate 10 is processed into a desired shape, and the photoresist pattern is removed. At this time, a plurality of stacked parts configured from a part of the stacked layer may be formed by etching.

Next, an operation to form a photoresist pattern on the stacked part by a photolithography method or the like is performed again. At this time, an opening of the photoresist pattern is formed to be within the stacked part in the top view.

Next, the stacked part is etched by a publicly known method, such as an ion milling method, using the photoresist pattern formed on the stacked part as a mask. At this time, the etching is stopped near the non-magnetic layer of a structure of "the ferromagnetic layer/the non-magnetic layer/the ferromagnetic layer" included in the stacked part, and the photoresist pattern is removed. At this time, a part of the lower-side ferromagnetic layer may be etched. Consequently, the element part 20 is formed.

Next, an insulation layer to be the protection layer 40 is deposited so as to cover the entire substrate 10 including the element part 20 by a publicly known method, such as a CVD method. A photoresist pattern for forming the opening 40a is formed on the insulation layer by a photolithography method or the like. Furthermore, the insulation layer is etched by a publicly known method, such as RIE, to form the opening 40a, and the photoresist pattern is removed. Consequently, the protection layer 40 having the opening 40a is formed.

Next, a photoresist pattern for forming the wiring part 50 and the electrode 51 is formed on the protection layer 40 having the opening 40a by a photolithography method or the like. Furthermore, a metal thin layer is deposited by a publicly known method, such as a sputtering method, the metal thin layer on the photoresist pattern is peeled by removing the photoresist pattern, and the wiring part 50 and the electrode 51 are formed at the same time.

Next, an insulation layer to be the protection layer 41 is deposited on the whole surface by a publicly known method, such as a CVD method, and furthermore, the plating seed layer 31 is formed on the protection layer 41 by a publicly known method, such as a sputtering method. Furthermore, an operation to form a photoresist pattern in which only a region for forming the magnetic flux concentrator 30 is opened on the seed layer 31 by a photolithography method or the like is performed.

Next, a plating layer to be the magnetic flux concentrator 30 is formed by a publicly known method, such as electrolytic plating, and the photoresist pattern is removed. Furthermore, the seed layer 31 that covers the exposed entire surface is removed by a publicly known method, such as an ion milling method, to form the magnetic flux concentrators 30L, 30R. Furthermore, an operation to form a photoresist pattern in which only a region to be the electrode 51 is opened by a photolithography method or the like is performed. Then, the insulation layer to be the protection layer 41 is etched by a publicly known method, such as RIE, to form the energization window 41a, and the photoresist pattern is removed. The electrode 51 can be connected to an external terminal by the operation.

The magnetic sensor 1 according to the first embodiment of the present invention can be obtained by the above processes.

EXAMPLES

Hereinafter, examples of the present invention will be described. In the examples, the magnetic sensor was manufactured to have the overlap region P in which the element part 20 and the magnetic flux concentrator 30 overlap in the top view, and the magnetic sensitivity thereof was examined.

Example 1

[Formation of Magnetic Sensor]

The magnetic sensor 1 illustrated in FIG. 11 was manufactured through the following deposition and device fabrication process, as a magnetic sensor according to Example 1. The cross-sectional view of A-A' in FIG. 11 corresponds to FIG. 1B.

First, as illustrated in FIG. 13, on the substrate 10 on whose surface about 1 μm of $SiO_2$ is deposited, a stacked layer was formed by stacking, in the following order, Ta to be a foundation layer of the free layer 21, a multi-layer structure in which NiFe, Ru, and CoFeB to be the free layer 21 are stacked in this order, MgO to be the non-magnetic layer 22, a multi-layer structure in which CoFeB, Ru, CoFe, and IrMn to be the pinned layer 23 are stacked in this order, and a multi-layer structure in which Ta and Ru to be the cap layer are stacked in this order.

Next, three first photoresist patterns for forming a plurality of stacked parts to be the element parts 20 from the stacked layer was formed on the stacked layer by a photolithography method. Next, the plurality of stacked parts were formed by removing parts that are not covered by the first photoresist patterns in the stacked layer using an ECR plasma etching device. Then, the first photoresist patterns were removed.

Next, six second photoresist patterns for forming the element parts 20 were formed on each of all the stacked parts by a photolithography method. Next, the stacked parts that are not covered by the second photoresist patterns were removed to a layer to be the non-magnetic layer 22 using an ECR plasma etching device. Consequently, the plurality of element parts 20 were formed on the substrate 10. Then, the second photoresist patterns were removed.

Next, the protection layer 40 composed of $SiO_2$ was deposited on the substrate 10 on which the plurality of element parts 20 are formed. Next, for manufacturing the openings 40a, a third photoresist pattern that exposes only the vicinities of the centers of the pinned layers 23 of all the element parts 20 and covers a region other than them was formed on the protection layer 40 by a photolithography method. Then, an exposed part of the protection layer 40 was etched using a RIE etching device using the third photoresist pattern as a mask. Consequently, the protection layer 40 having the openings 40a for connection with the wiring part 50 was formed. Then, the third photoresist pattern was removed.

Next, a fourth photoresist pattern that exposes a region in which the wiring part 50 that connects the respective openings 40a in series is formed and a region in which the electrode 51 is formed and covers a region other than them was formed on the protection layer 40 by a photolithography method. Next, a metal layer was stacked on the whole surface using a magnetron sputtering device. Then, the fourth photoresist pattern was removed by a liftoff method, and the wiring part 50 and the electrode 51 were formed from the metal layer.

Next, heat treatment (first heat treatment) was performed at 325° C. for one hour using an in-magnetic-field heat treating device while applying a magnetic field in the direction perpendicular to the magnetosensitive axis direction in the plane of the layer, and cooling was performed to 100° C. or less while applying the magnetic field. Then, furthermore, heat treatment (second heat treatment) was performed at 325° C. for one hour while applying a magnetic field in the magnetosensitive axis direction, and cooling was performed to 100° C. or less while applying the magnetic field.

Next, the protection layer 41 composed of $SiO_2$ was stacked on the whole surface of the substrate 10 including the wiring part 50 and the electrode 51, and then, a Ta/Cu layer to be the seed layer 31 was further stacked on the whole surface of the protection layer 41 using a magnetron sputtering device. Furthermore, a fifth photoresist pattern that covers other than a region in which the magnetic flux concentrator 30 is formed was formed on the Ta/Cu layer to be the seed layer 31 by a photolithography method.

Next, the magnetic flux concentrator 30 was formed on the seed layer 31 in the opening of the fifth photoresist pattern by electrolytic plating. At this time, the magnetic flux concentrator 30 was formed such that end parts of the magnetic flux concentrators 30L, 30R on the side of the element part 20 cover both ends of the free layer 21, respectively, by 20 μm in the top view. Then, the fifth photoresist pattern was removed by a liftoff method, and the extra seed layer 31 was removed using an etching device. Furthermore, an operation to form a photoresist pattern in which only a region to be the electrode 51 is opened by a photolithography method or the like was performed to form a sixth photoresist pattern. Then, an exposed part of the protection layer 41 was etched using a RIE etching device using the sixth photoresist pattern as a mask, and the photoresist pattern was removed.

The magnetic sensor 1 was manufactured by the above operation.

While applying a voltage of 1 V to the manufactured magnetic sensor 1, a measurement of a magneto resistance change was performed by changing an external magnetic field within the range of "−0.6 Oe or more and 0.6 Oe or less" from the magnetosensitive axis direction.

Comparative Example 1

Next, Comparative Example 1 will be described.

Figure 2A:
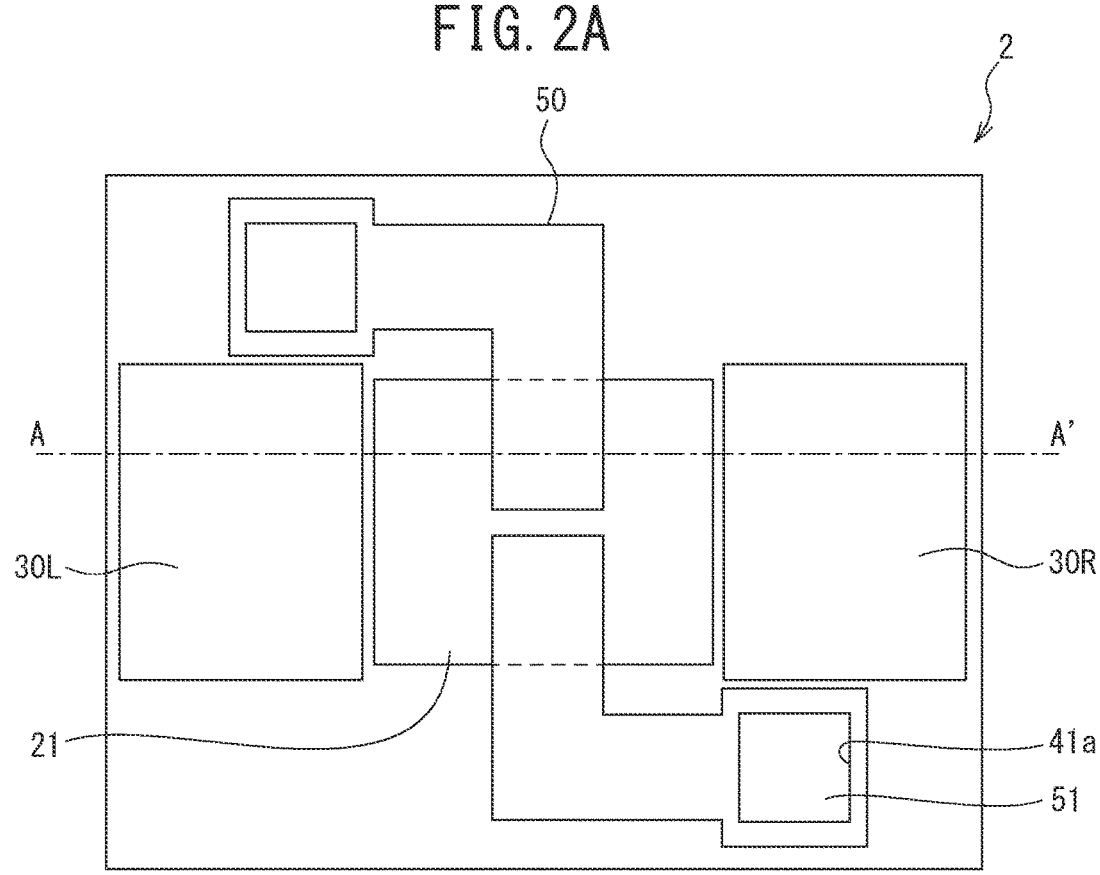
FIGS. 2A and 2B are schematic configuration diagrams illustrating an example of a magnetic sensor as a comparative example.
Figure 2B:
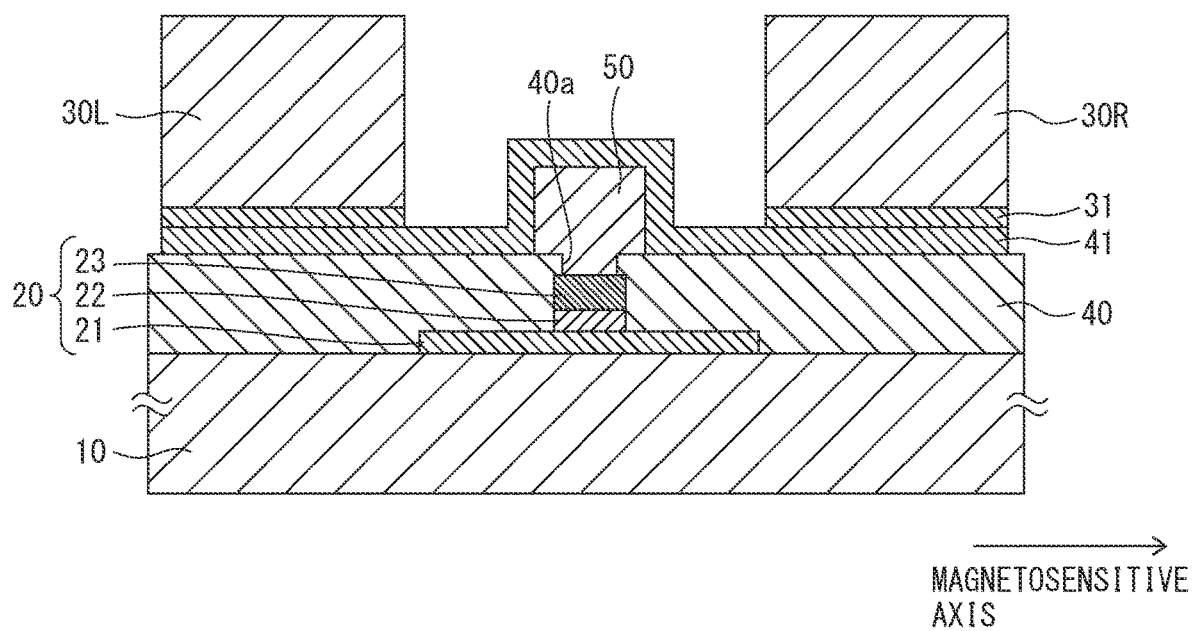
Figure 14:
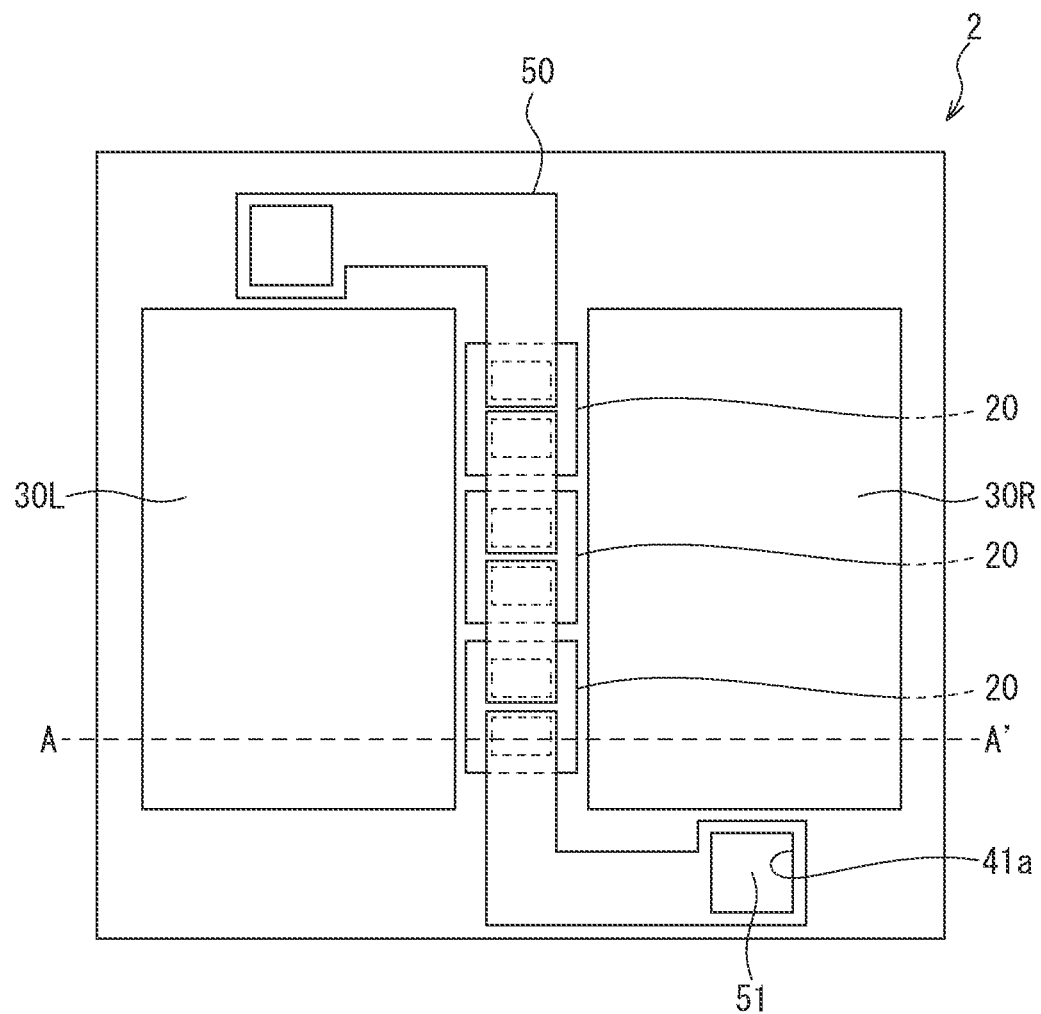
FIG. 14 is a plan view of another example of a magnetic sensor as a comparative example.

FIG. 14 is a plan view illustrating an example of a configuration of a magnetic sensor 2 according to Comparative Example 1, the example including three element parts 20. It is to be noted that a border line inside the magnetic sensor 2, a part of which is not exposed to the outside, is also indicated by broken lines in FIG. 14, for clarifying the overlap between the respective layers. In addition, FIG. 2A corresponds to a plan view of the magnetic sensor in a case where only one element part 20 presents in FIG. 14. FIG. 2B corresponds to the cross-sectional view in A-A' of FIG. 14 and the cross-sectional view in A-A' of FIG. 2A.

The magnetic sensor 2 according to Comparative Example 1 illustrated in FIG. 14 was formed by changing the magnetic sensor 1 in Example 1 illustrated in FIG. 11 such that the end parts of the magnetic flux concentrators 30 on the side of the element part 20 are located away from the both ends of the free layer 21, respectively, by 5 μm in the top view. Everything other than this is similar to the magnetic sensor 1 in Example 1, and the same part has the same configuration. In addition, the formation of the magnetic sensor 2 and the measurement of the magneto resistance change were performed by a method similar to Example 1.

<Comparison of Sensitivity>

A comparison of sensitivity between Example 1 and Comparative Example 1 was made.

The principle of the resistance change of the magnetic sensor 1 according to one embodiment of the present invention is due to the TMR effect (Tunnel Magneto Resistance effect) that is already publicly known. The change in a resistance value by the TMR effect is due to a change of a relative angle between magnetization of the free layer and magnetization of the pinned layer, and the resistance is changed at the interface thereof. As is publicly known, the definition of the sensitivity of a TMR sensor or the like can be represented by the following equation (1), where a resistance value when the relative angle of magnetization is 00 is Rp, a resistance value when the relative angle of magnetization is 180° is Rap, and the range of the resistance change is 2Hk.

$$(((Rap-Rp)/Rp) \times 100)/2Hk[\%/Oe] \qquad (1)$$

When comparing the sensitivity by the above definition, the sensitivity was 226%/Oe in Example 1, and the sensitivity was 118%/Oe in Comparative Example 1. As can be seen from FIGS. 11 and 14, the difference between Example 1 and Comparative Example 1 is only the arrangement position of the magnetic flux concentrator 30. According to the above result, in the magnetic sensor 1 according to one embodiment of the present invention, in other words, when the free layer 21 and the magnetic flux concentrators 30L, 30R overlap, respectively, in the top view, the sensitivity is higher.

Example 2

Next, Example 2 will be described.

In Example 2, a magnetic material group having the same configurations as the respective magnetic materials in the magnetic sensor 1 of Example 1 was assumed, and a magnetic field analysis simulation by a finite element method was performed. It is to be noted that, in Example 3 to Example 25, and Comparative Example 2 to Comparative Example 10 described below, the magnetic field analysis simulation was performed in the same manner.

In the magnetic field analysis simulation, a magnetic material having an arbitrary shape and permeability can be manufactured on a computer. A magnetic material whose shape is defined is divided into small regions having arbitrary shapes, and a magnetic field is applied, so that a magnetization state of each of the small regions in the magnetic material can be calculated. Large or small of a magnetization value of the magnetic material corresponds to an amplification factor of the sensitivity.

In Example 2, a magnetic material 30' corresponding to the magnetic flux concentrator 30 and a magnetic material 21' corresponding to the free layer 21 were defined, and how much larger the magnetization of the magnetic material 21' in the presence of the magnetic material 30' is with respect to the magnetization of the magnetic material 21' in the absence of the magnetic material 30' was investigated. This value is defined as the "amplification factor".

Here, a part in which the resistance change of the magnetic sensor 1 according to one embodiment of the present invention occurs is a part in which the free layer 21 and the pinned layer 23 overlap in the top view. The change of the magnetization of a region in which the free layer 21 and the pinned layer 23 overlap in the top view corresponds to the resistance change of the magnetic sensor 1 according to one embodiment of the present invention. In the present simulation, a region in the vicinity of the center of the magnetic material 21' was regarded as a magnetosensitive area 23', and an average value of the magnetization of the magnetosensitive area 23' was used for the calculation of the amplification factor.

It is to be noted that, for simplifying the calculation, the amplification factor is calculated while conforming the length of the magnetosensitive area 23' to the length of the magnetic material 21' in the following examples, but the length of the magnetosensitive area 23' in the direction perpendicular to the magnetosensitive axis may be different from the length of the magnetic material 21'. This is because the amplification factor depends on the average value of the magnetization of the magnetosensitive area 23', and thus, the average value of the magnetization is nearly unchanged even when the length in the direction perpendicular to the magnetosensitive axis is changed. In addition, here, in the top view, the area of a region in which the magnetic material 21' and the magnetic material 30' overlap is defined as an "area P", the area of a region in which the magnetosensitive area 23' and the magnetic material 30' overlap is defined as an "area Q", and an area of a part that does not overlap with the magnetosensitive area 23' in the region in which the magnetic material 21' and the magnetic material 30' overlap is defined as an "area R".

The relationship between the areas P, Q, and R is illustrated in FIGS. 10A and 10B. The areas P, Q, and R correspond to the above-described overlap region P, overlap part Q, and overlap part R, and have a relationship of P=Q+R.

The cases where the "area P" is larger than "0" are the Examples, and the cases where the "area P" is "0" are the Comparative Examples.

Figure 3A:
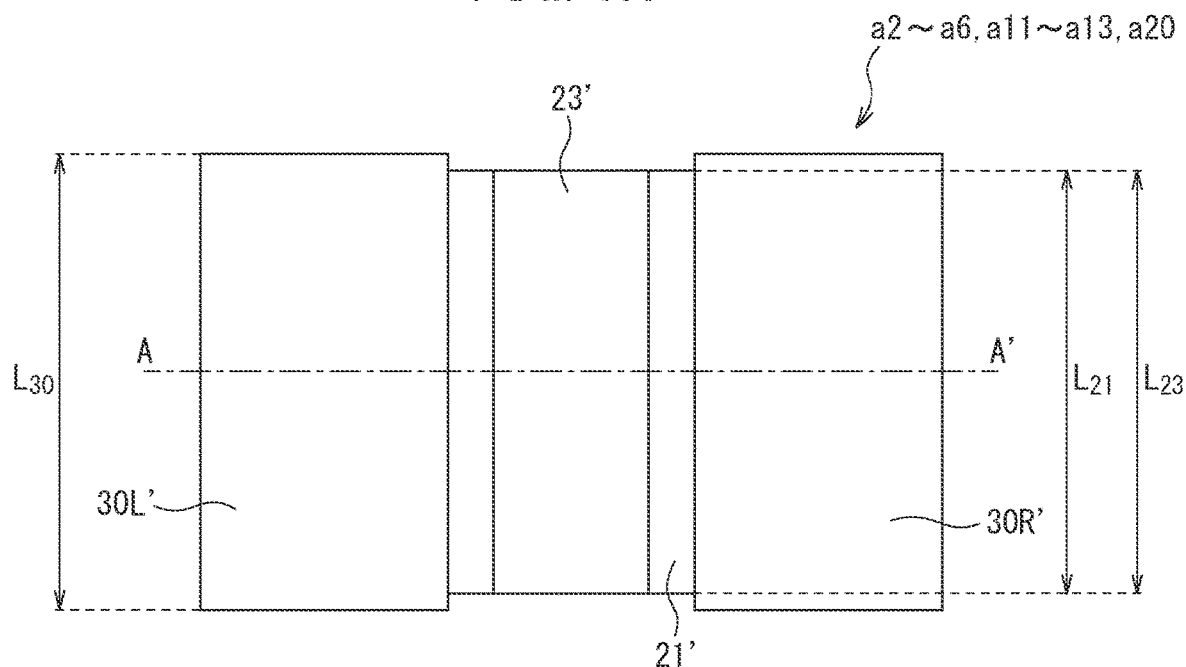
FIGS. 3A and 3B are diagrams illustrating an example of arrangement of a magnetic body group.
Figure 3B:
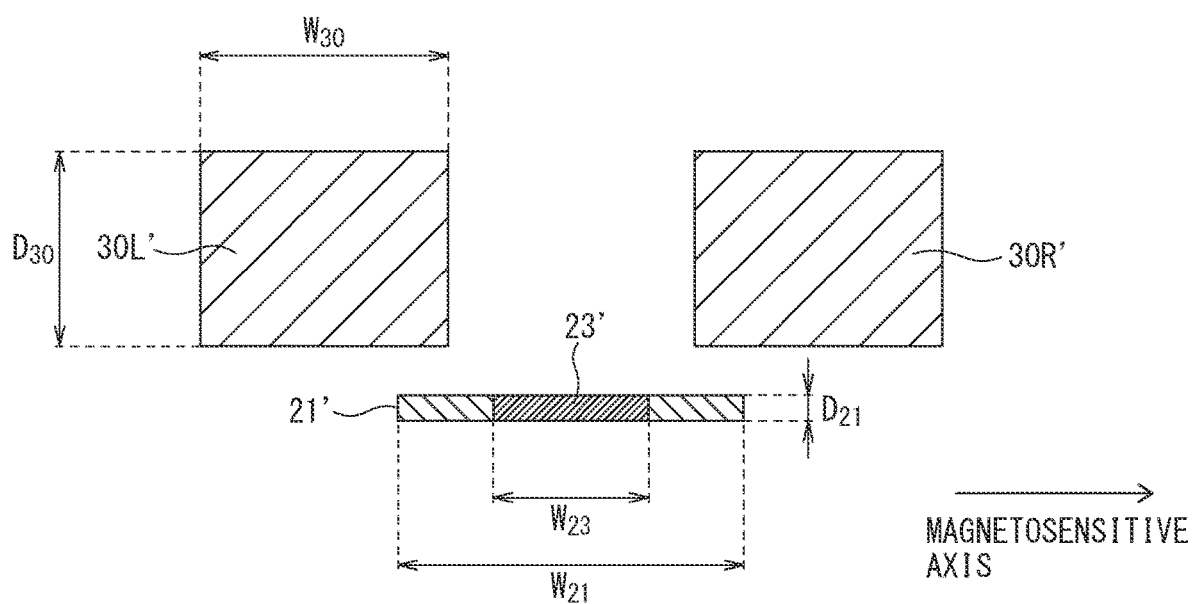

FIGS. 3A and 3B are schematic diagrams illustrating arrangement of a magnetic material group a2 according to Example 2, in which FIG. 3A is a plan view, and FIG. 3B is a cross-sectional view of A-A' in FIG. 3A. It is to be noted that, hereinafter, the magnetic material group indicates the magnetic material 21' corresponding to the free layer 21, the magnetosensitive area 23' corresponding to the pinned layer 23, a magnetic material 30L' corresponding to the magnetic flux concentrator 30L, and a magnetic material 30R' corresponding to the magnetic flux concentrator 30R.

First, regarding the magnetic material group having the same configurations as the respective magnetic materials in the magnetic sensor 1 on the magnetic field analysis simulation, the magnetic material 21' corresponding to the free layer 21 was arranged to have the length $L_{21}$=140 µm, the width $W_{21}$=100 µm, the thickness $D_{21}$=0.1 µm, and the permeability of 2000. The magnetic materials 30L', 30R' corresponding to the magnetic flux concentrators 30L, 30R according to the present invention were arranged such that the bottom surfaces thereof are located on a plane away from the center of the thickness $D_{21}$ of the magnetic material 21' by 1 µm in a thickness direction. The magnetic materials 30L', 30R' were respectively arranged on the left side and the right side in a width direction of the magnetic material 21' to have the length $L_{30}$=750 µm, the width $W_{30}$=10 mm, the thickness $D_{30}$=10 µm, and the permeability of 2000. At this time, the magnetic materials 30L', 30R' were arranged such that the right end of the magnetic material 30L' in the width direction is located on the right side of the left end of the magnetic material 21' in the width direction with an interval of 5 µm, and the left end of the magnetic material 30R' in the width direction is located on the left side of the right end of the magnetic material 21' in the width direction with an interval of 5 µm, in the top view. In addition, the magnetosensitive area 23' was defined to have the gravity center located at the same position as that of the magnetic material 21' and a size of the length $L_{23}$=140 µm and the width $W_{23}$=40 µm.

By giving a definition in this manner, in Example 2, the area P is 140×5×2=1400 µm². In addition, since the magnetosensitive area 23' and the magnetic materials 30' (30L', 30R') do not have an overlap part, the area Q is 0 µm², and the area R is R=P−Q, and thus, 1400 µm².

Therefore, the area Q is smaller than the area R.

In addition, the ratio of the area Q to the magnetosensitive area 23' is "0".

As illustrated in FIGS. 3A and 3B, a magnetic field of 0.1 nT was applied to the magnetic material 21' and the magnetic materials 30L', 30R' arranged as described above from left to right in FIGS. 3A and 3B, i.e. in the magnetosensitive axis direction of the magnetic material 21' (element part 20), and the magnetization of the magnetosensitive area 23' of the magnetic material 21' at this time was obtained.

In addition, by arranging only the magnetic material 21' without arranging the magnetic materials 30L', 30R', the magnetization of the magnetosensitive area 23' was obtained by the same procedure, and an average value of the amplification factor of the magnetosensitive area 23' was calculated.

Hereinafter, Example 3 to Example 25, and Comparative Example 2 to Comparative Example 10 will be described.

Each of magnetic material groups a3 to a25 according to Example 3 to Example 25 and magnetic material groups b2 to b10 according to Comparative Example 2 to Comparative Example 10 has the similar structures as the respective magnetic materials in the magnetic sensor 1 on the magnetic field analysis simulation in Example 2. In addition, each of the magnetic material groups a3 to a25, b2 to b10 is obtained by changing the arrangement position of the magnetic materials 30L', 30R' and the magnetic material 21' and the width $W_{23}$ of the magnetosensitive area 23' in Example 2. Everything other than that was similar to the method of Example 2, and the average value of the amplification factor of the magnetosensitive area 23' was calculated.

Here, when the magnetic materials 30L', 30R' are arranged such that the magnetic materials 30L', 30R' respectively overlap with the magnetic material 21' at the right and left ends of the magnetic material 21' in the width direction in the top view, an overlapping width between the magnetic material 30L' and the magnetic material 21' is referred to as an overlap width WP. It is to be noted that the magnetic materials 30L', 30R' are arranged such that the overlapping width between the magnetic material 30L' and the magnetic material 21' is equal to the overlapping width between the magnetic material 30R' and the magnetic material 21'. In other words, the magnetic materials 30L', 30R' are arranged such that the positional relationship between the magnetic material 21' and the magnetic material 30L' is the same as the positional relationship between the magnetic material 21' and the magnetic material 30R'. In addition, when the magnetic materials 30L', 30R' are arranged such that the magnetic materials 30L', 30R' respectively do not overlap with the magnetic material 21' at the right and left ends of the magnetic material 21' in the width direction in the top view, a distance between the magnetic material 30L' and the magnetic material 21' is represented by the overlap width WP having a negative value.

Example 3

A schematic diagram illustrating arrangement of the magnetic material group a3 according to Example 3 is the same as the schematic diagram illustrated in FIGS. 3A and 3B.

Example 3 is obtained by changing the overlap width WP to 10 μm in Example 2. The width $W_{23}$ of the magnetosensitive area 23' is 40 μm.

In Example 3, the area P is 140×10×2=2800 μm². In addition, since the magnetosensitive area 23' and the magnetic materials 30' do not have an overlap part, the area Q is 0 μm², and the area R is R=P–Q, and thus, 2800 μm².

Therefore, the area Q is smaller than the area R. In addition, the ratio of the area Q to the magnetosensitive area 23' is "0".

Example 4

A schematic diagram illustrating arrangement of the magnetic material group a4 according to Example 4 is the same as the schematic diagram illustrated in FIGS. 3A and 3B.

Example 4 is obtained by changing the overlap width WP to 15 μm in Example 3.

In Example 4, the area P is 140×15×2=4200 μm². In addition, the area Q is 0 μm², and the area R is 4200 μm².

Therefore, the area Q is smaller than the area R. In addition, the ratio of the area Q to the magnetosensitive area 23' is "0".

Example 5

A schematic diagram illustrating arrangement of the magnetic material group a5 according to Example 5 is the same as the schematic diagram illustrated in FIGS. 3A and 3B.

Example 5 is obtained by changing the overlap width WP to 20 μm in Example 3.

In Example 5, the area P is 140×20×2=5600 μm². In addition, the area Q is 0 μm², and the area R is 5600 μm².

Therefore, the area Q is smaller than the area R. In addition, the ratio of the area Q to the magnetosensitive area 23' is "0".

Example 6

A schematic diagram illustrating arrangement of the magnetic material group a6 according to Example 6 is the same as the schematic diagram illustrated in FIGS. 3A and 3B.

Example 6 is obtained by changing the overlap width WP to 25 μm in Example 3.

In Example 6, the area P is 140×25×2=7000 μm². In addition, the area Q is 0 μm², and the area R is 7000 μm².

Therefore, the area Q is smaller than the area R. In addition, the ratio of the area Q to the magnetosensitive area 23' is "0".

Example 7

Figure 4A:
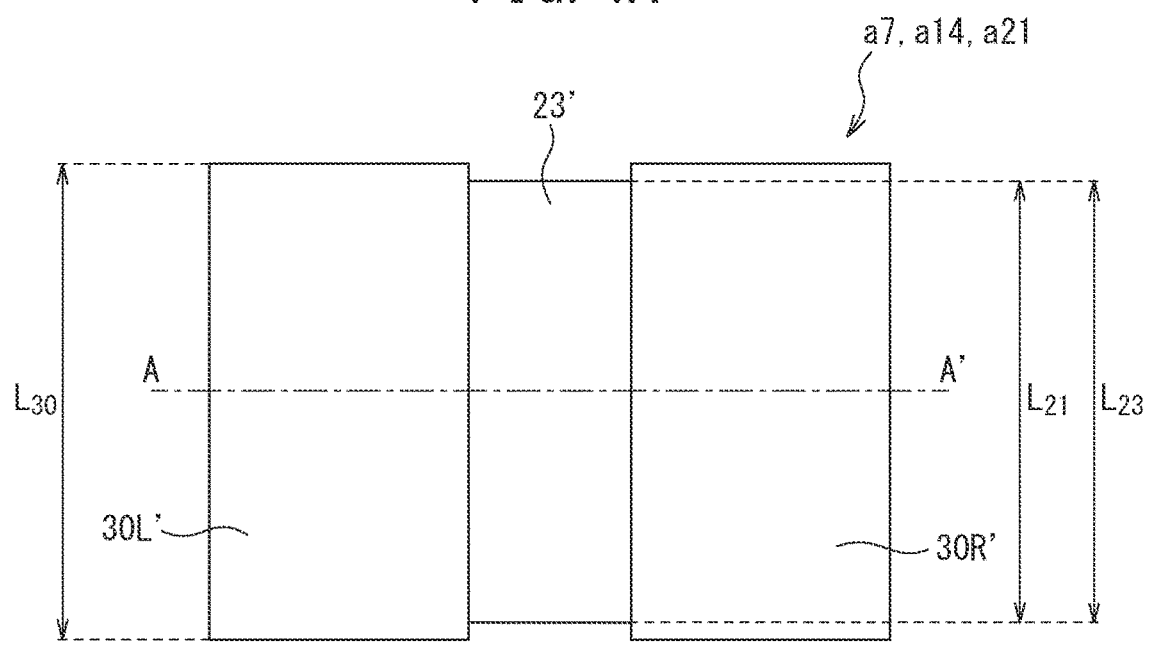
FIGS. 4A and 4B are diagrams illustrating an example of arrangement of a magnetic body group.
Figure 4B:
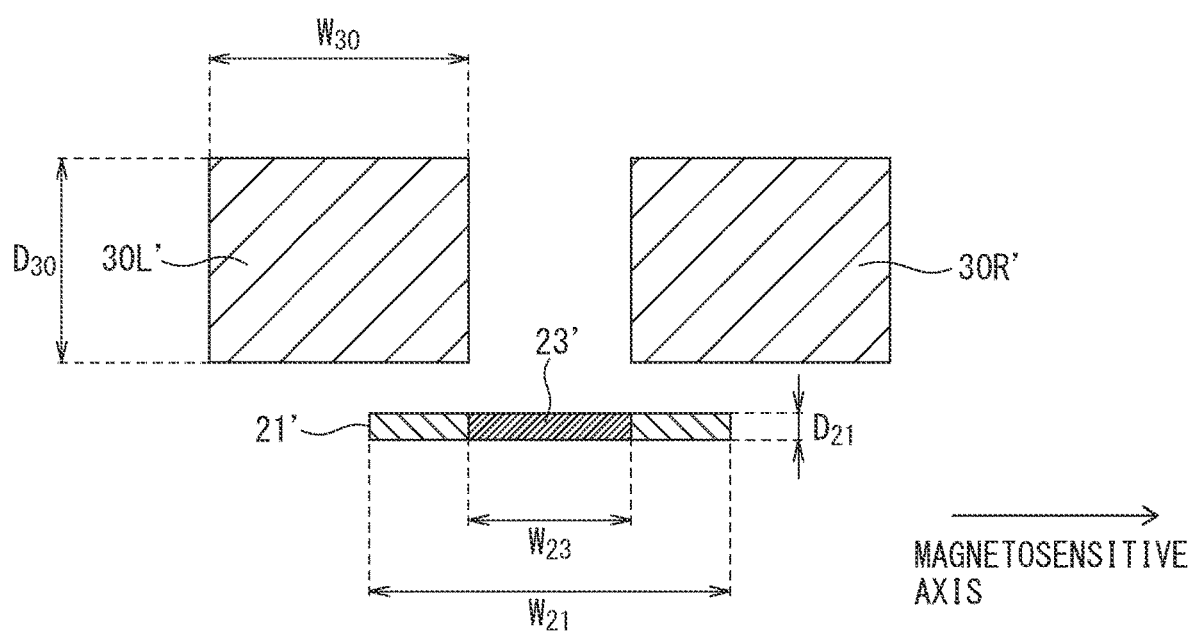

FIGS. 4A and 4B are schematic diagram illustrating arrangement of the magnetic material group a7 according to Example 7, in which FIG. 4A is a plan view, and FIG. 4B is a cross-sectional view of A-A' in FIG. 4A.

Example 7 is obtained by changing the overlap width WP to 30 μm in Example 3. In other words, the magnetic materials 30L', 30R' are arranged such that the right end of the magnetic material 30L' in the width direction coincides with the left end of the magnetosensitive area 23' in the width direction, and the left end of the magnetic material 30R' in the width direction coincides with the right end of the magnetosensitive area 23' in the width direction, in the top view.

In Example 7, the area P is 140×30×2=8400 μm². In addition, the area Q is 0 μm², and the area R is 8400 μm².

Therefore, the area Q is smaller than the area R. In addition, the ratio of the area Q to the magnetosensitive area 23' is "0".

Example 8

Figure 5A:
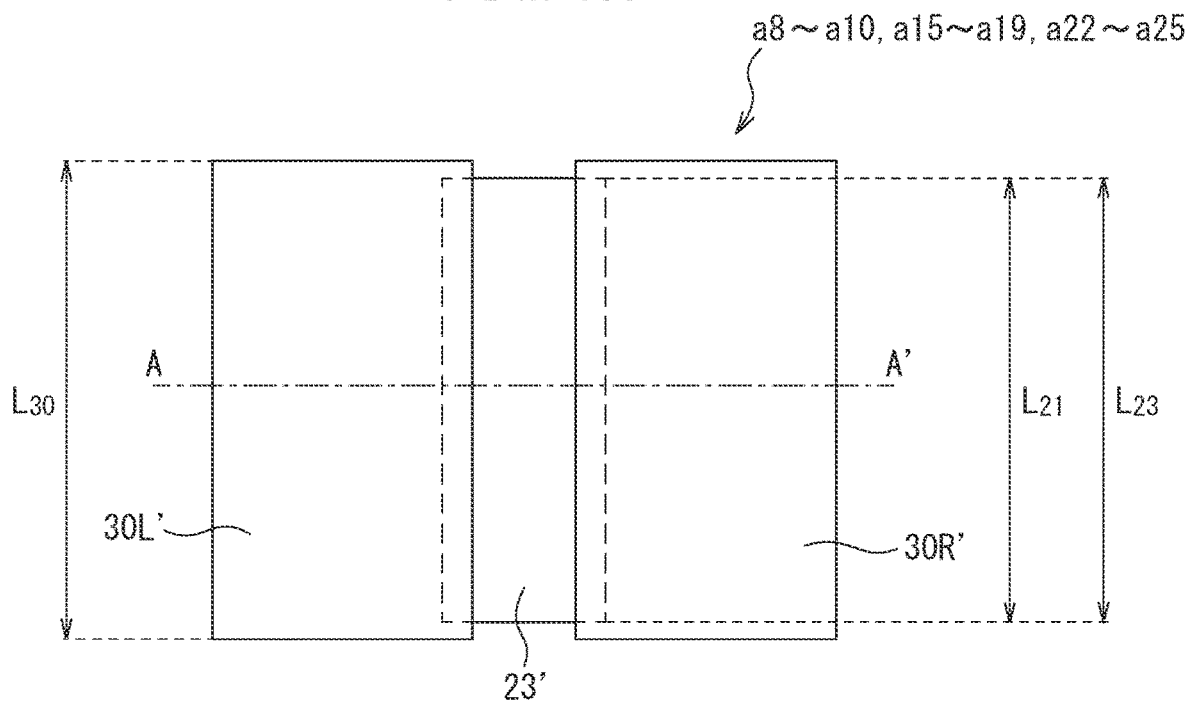
FIGS. 5A and 5B are diagrams illustrating an example of arrangement of a magnetic body group.
Figure 5B:
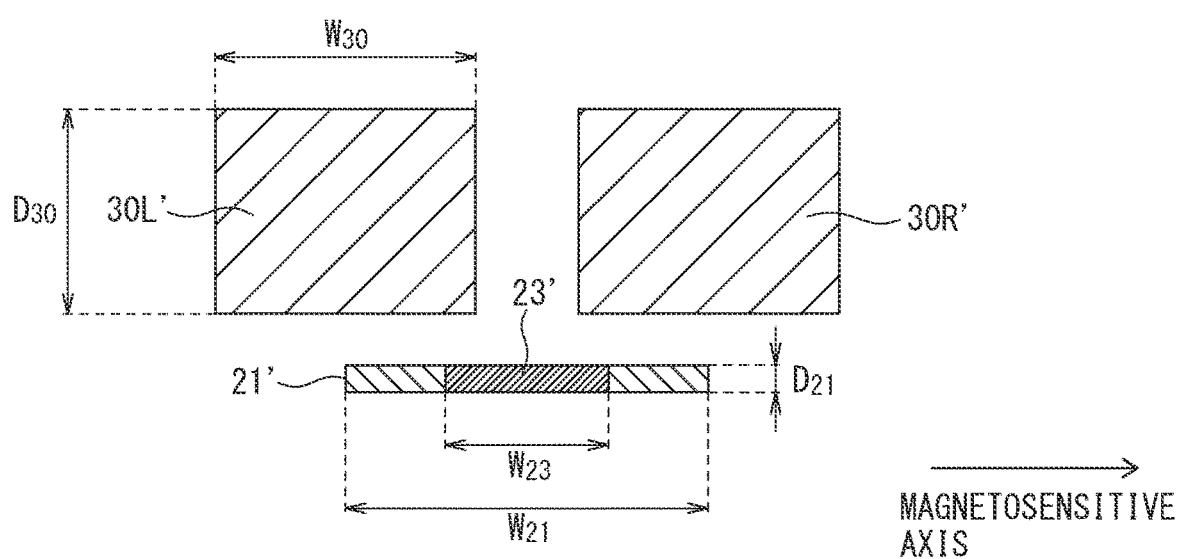

FIGS. 5A and 5B are schematic diagrams illustrating arrangement of the magnetic material group a8 according to Example 8, in which FIG. 5A is a plan view, and FIG. 5B is a cross-sectional view of A-A' in FIG. 5A.

Example 8 is obtained by changing the overlap width WP to 35 μm in Example 3.

In Example 8, the area P is 140×35×2=9800 μm². In addition, since the magnetosensitive area 23' and the magnetic materials 30' have the overlap widths each having a width of 5 μm on both sides of the magnetosensitive area 23', the area Q is 140×5×2=1400 μm², and the area R is 8400 μm².

Therefore, the area Q is smaller than the area R. In addition, the area of the magnetosensitive area 23' is 140×40=5600 μm², and thus, the ratio of the area Q to the magnetosensitive area 23' is ¼.

Example 9

A schematic diagram illustrating arrangement of the magnetic material group a9 according to Example 9 is the same as the schematic diagram illustrated in FIGS. 5A and 5B.

Example 9 is obtained by changing the overlap width WP to 37.5 μm in Example 8.

In Example 9, the area P is 140×37.5×2=10500 μm². In addition, since there are the overlap widths each having a width of 7.5 μm on both sides of the magnetosensitive area 23', the area Q is 140×7.5×2=2100 μm², and the area R is 8400 μm².

Therefore, the area Q is smaller than the area R. In addition, the area of the magnetosensitive area 23' is 140×40=5600 μm², and thus, the ratio of the area Q to the magnetosensitive area 23' is ⅜.

Example 10

A schematic diagram illustrating arrangement of the magnetic material group a10 according to Example 10 is the same as the schematic diagram illustrated in FIGS. 5A and 5B.

Example 10 is obtained by changing the overlap width WP to 40 μm in Example 8.

In Example 10, the area P is 140×40×2=11200 μm. In addition, since there are the overlap widths each having a width of 10 μm on both sides of the magnetosensitive area 23', the area Q is 140×10×2=2800 μm², and the area R is 8400 μm².

Therefore, the area Q is smaller than the area R. In addition, the area of the magnetosensitive area 23' is 140×40=5600 μm², and thus, the ratio of the area Q to the magnetosensitive area 23' is ½.

Comparative Example 2

Figure 6A:
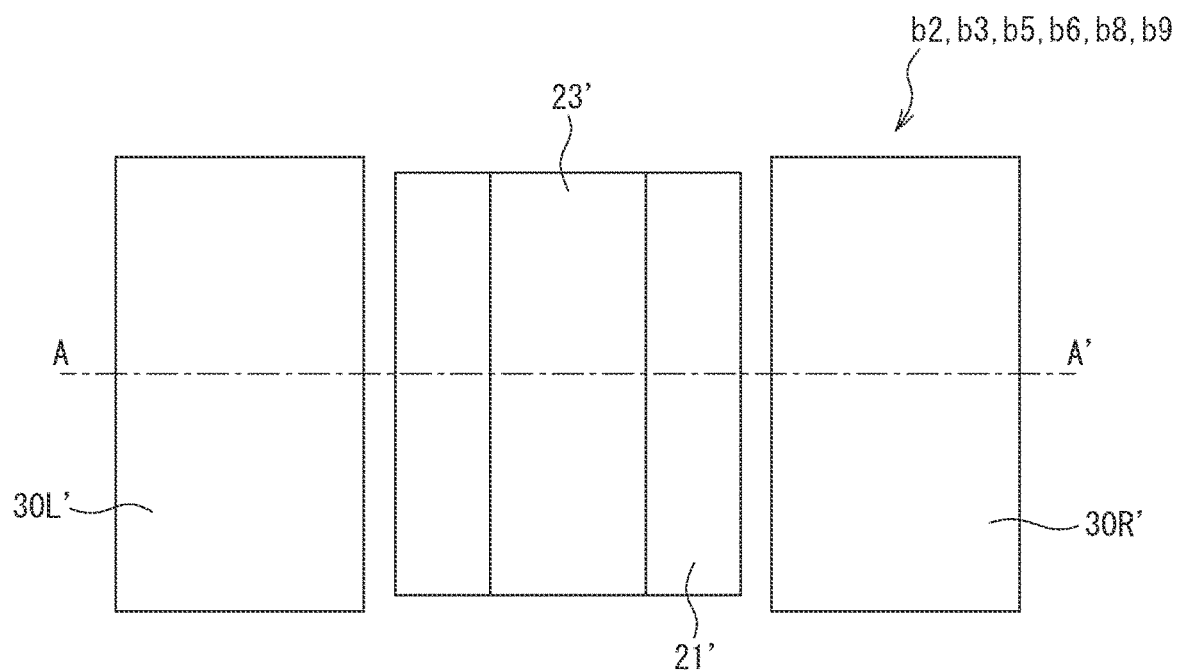
FIGS. 6A and 6B are diagrams illustrating an example of arrangement of a magnetic body group.
Figure 6B:
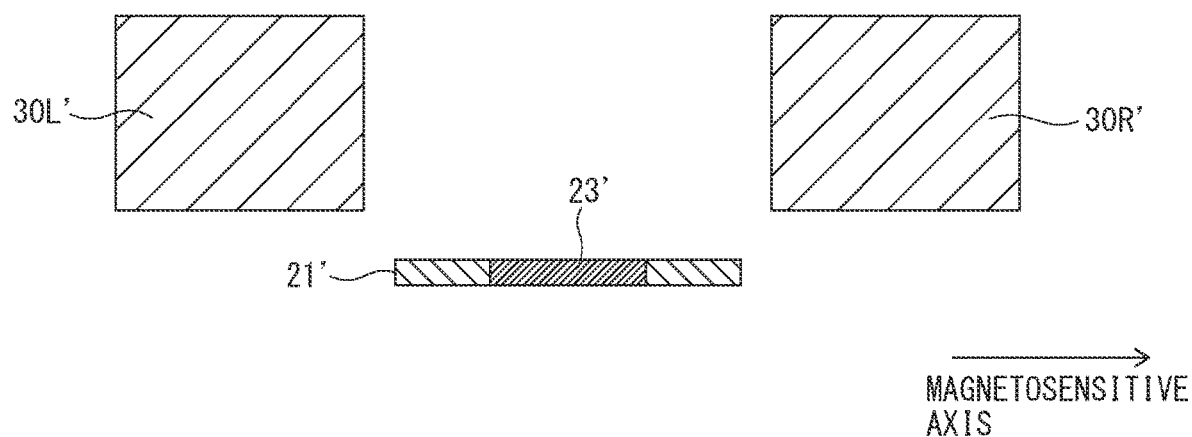

FIGS. 6A and 6B are schematic diagrams illustrating arrangement of the magnetic material group b2 according to Comparative Example 2, in which FIG. 6A is a plan view, and FIG. 6B is a cross-sectional view of A-A' in FIG. 6A.

Comparative Example 2 is obtained by arranging the magnetic materials 30L', 30R' and the magnetic material 21' such that the right end of the magnetic material 30L' in the width direction is located on the left side of the left end of the magnetic material 21' in the width direction with an interval of 10 μm, and the left end of the magnetic material 30R' in the width direction is located on the right side of the right end of the magnetic material 21' in the width direction with an interval of 10 μm, in the top view, in Example 3. In other words, the overlap width WP is changed to −10 μm. The width $W_{23}$ of the magnetosensitive area 23' is 40 μm.

In Comparative Example 2, since the magnetic material 21' and the magnetic materials 30' do not have an overlap part, the area P is 0 μm$^2$, the area P is P=Q+R, and thus, all of the areas P, Q, and R are 0 μm$^2$.

Comparative Example 3

A schematic diagram illustrating arrangement of the magnetic material group b3 according to Comparative Example 3 is the same as the schematic diagram illustrated in FIGS. 6A and 6B.

Comparative Example 3 is obtained by changing the overlap width WP to −5 μm in Comparative Example 2.

In Comparative Example 3, the area P is 0 μm$^2$, and all of the areas P, Q, and R are 0 μm$^2$.

Comparative Example 4

Figure 7A:
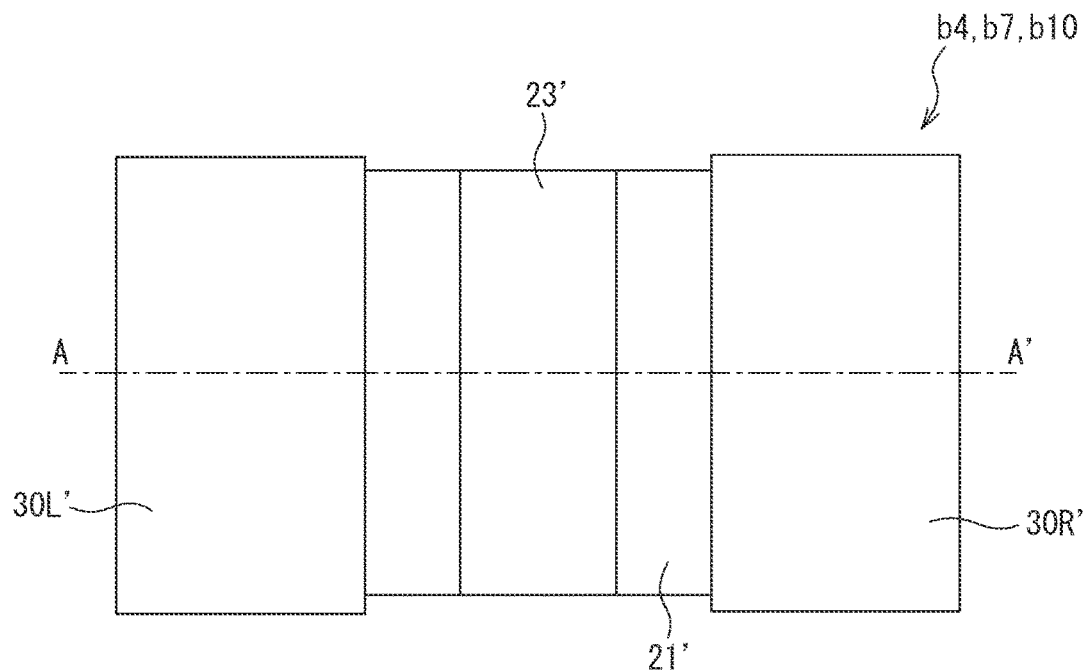
FIGS. 7A and 7B are diagrams illustrating an example of arrangement of a magnetic body group.
Figure 7B:
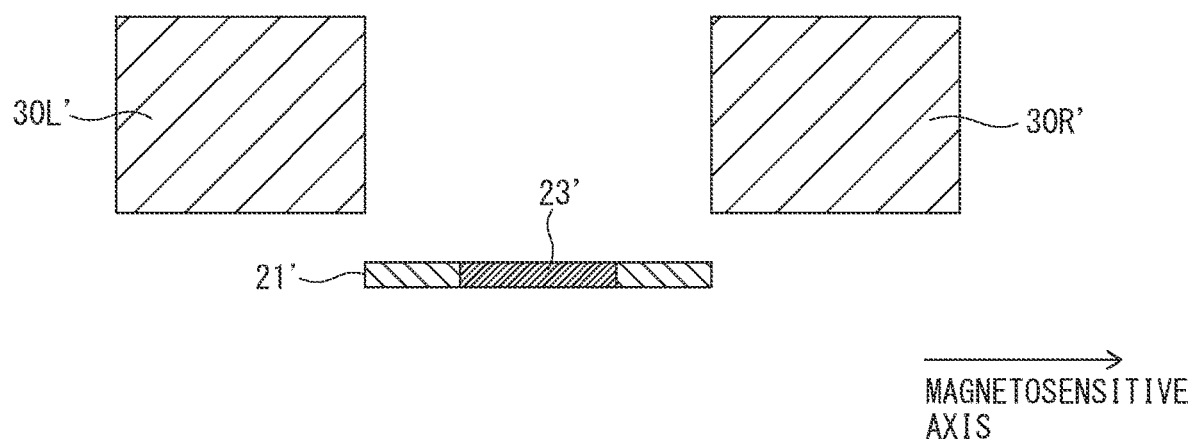

FIGS. 7A and 7B are schematic diagrams illustrating arrangement of the magnetic material group b4 according to Comparative Example 4, in which FIG. 7A is a plan view, and FIG. 7B is a cross-sectional view of A-A' in FIG. 7A.

Comparative Example 4 is obtained by arranging the magnetic materials 30L', 30R' and the magnetic material 21' such that the right end of the magnetic material 30L' in the width direction coincides with the left end of the magnetic material 21' in the width direction, and the left end of the magnetic material 30R' in the width direction coincides with the right end of the magnetic material 21' in the width direction, in the top view, in Comparative Example 2. In other words, the overlap width WP is changed to 0 μm.

In Comparative Example 4, the area P is 0 μm$^2$, and all of the areas P, Q, and R are 0 μm$^2$.

Example 11

A schematic diagram illustrating arrangement of the magnetic material group a11 according to Example 11 is the same as the schematic diagram illustrated in FIGS. 3A and 3B.

Example 11 is obtained by defining the magnetosensitive area 23' in Example 2 to have the gravity center located at the same position as that of the magnetic material 21' and a size of the length $L_{23}$=140 μm and the width $W_{23}$=60 μm. In addition, the overlap width WP is changed to 5 μm.

In Example 11, the area P is 140×5×2=1400 μm$^2$. In addition, since the magnetosensitive area 23' and the magnetic materials 30' do not have an overlap part, the area Q is 0 μm$^2$, and the area R is 1400 μm$^2$.

Therefore, the area Q is smaller than the area R. In addition, the ratio of the area Q to the magnetosensitive area 23' is "0".

Example 12

A schematic diagram illustrating arrangement of the magnetic material group a12 according to Example 12 is the same as the schematic diagram illustrated in FIGS. 3A and 3B.

Example 12 is obtained by changing the overlap width WP to 10 μm in Example 11.

In Example 12, the area P is 140×10×2=2800 μm$^2$. In addition, the area Q is 0 μm$^2$, and the area R is 2800 μm$^2$.

Therefore, the area Q is smaller than the area R. In addition, the ratio of the area Q to the magnetosensitive area 23' is "0".

Example 13

A schematic diagram illustrating arrangement of the magnetic material group a13 according to Example 13 is the same as the schematic diagram illustrated in FIGS. 3A and 3B.

Example 13 is obtained by changing the overlap width WP to 15 μm in Example 11.

In Example 13, the area P is 140×15×2=4200 μm$^2$. In addition, the area Q is 0 μm$^2$, and the area R is 4200 μm$^2$.

Therefore, the area Q is smaller than the area R. In addition, the ratio of the area Q to the magnetosensitive area 23' is "0".

Example 14

A schematic diagram illustrating arrangement of the magnetic material group a14 according to Example 14 is the same as the schematic diagram illustrated in FIGS. 4A and 4B.

Example 14 is obtained by changing the overlap width WP to 20 μm in Example 11. In other words, the magnetic materials 30L', 30R' are arranged such that the right end of the magnetic material 30L' in the width direction coincides with the left end of the magnetosensitive area 23' in the width direction, and the left end of the magnetic material 30R' in the width direction coincides with the right end of the magnetosensitive area 23' in the width direction, in the top view.

In Example 14, the area P is 140×20×2=5600 μm$^2$. In addition, since the magnetosensitive area 23' and the magnetic materials 30' do not have an overlap part, the area Q is 0 μm$^2$, and the area R is 5600 μm$^2$.

Therefore, the area Q is smaller than the area R. In addition, the ratio of the area Q to the magnetosensitive area 23' is "0".

Example 15

A schematic diagram illustrating arrangement of the magnetic material group a15 according to Example 15 is the same as the schematic diagram illustrated in FIGS. 5A and 5B.

Example 15 is obtained by changing the overlap width WP to 25 μm in Example 11.

In Example 15, the area P is 140×25×2=7000 μm$^2$. In addition, since the magnetosensitive area 23' and the magnetic materials 30' have the overlap widths each having a width of 5 μm on both sides of the magnetosensitive area 23', the area Q is 140×5×2=1400 m$^{12}$. In addition, the area R is 5600 μm$^2$.

Therefore, the area Q is smaller than the area R. In addition, the area of the magnetosensitive area 23' is 140× 60=8400 μm$^2$, and thus, the ratio of the area Q to the magnetosensitive area 23' is ⅙.

Example 16

A schematic diagram illustrating arrangement of the magnetic material group a16 according to Example 16 is the same as the schematic diagram illustrated in FIGS. 5A and 5B.

Example 16 is obtained by changing the overlap width WP to 30 μm in Example 15.

In Example 16, the area P is 140×30×2=8400 μm$^2$. In addition, since the magnetosensitive area 23' has the overlap widths each having a width of 10 μm, the area Q is 140×10×2=2800 μm$^2$, and the area R is 5600 μm$^2$.

Therefore, the area Q is smaller than the area R. In addition, the area of the magnetosensitive area 23' is 140× 60=8400 μm$^2$, and thus, the ratio of the area Q to the magnetosensitive area 23' is ⅓.

Example 17

A schematic diagram illustrating arrangement of the magnetic material group a17 according to Example 17 is the same as the schematic diagram illustrated in FIGS. 5A and 5B.

Example 17 is obtained by changing the overlap width WP to 35 μm in Example 15.

In Example 17, the area P is 140×35×2=9800 μm$^2$. In addition, since the magnetosensitive area 23' and the magnetic materials 30' have the overlap widths each having a width of 15 μm on both sides of the magnetosensitive area 23', the area Q is 140×15×2=4200 μm$^2$, and the area R is 5600 μm$^2$.

Therefore, the area Q is smaller than the area R. In addition, the area of the magnetosensitive area 23' is 140× 60=8400 μm, and thus, the ratio of the area Q to the magnetosensitive area 23' is ½.

Example 18

A schematic diagram illustrating arrangement of the magnetic material group a18 according to Example 18 is the same as the schematic diagram illustrated in FIGS. 5A and 5B.

Example 18 is obtained by changing the overlap width WP to 37.5 μm in Example 15.

In Example 18, the area P is 140×37.5×2=10500 μm$^2$. In addition, since the magnetosensitive area 23' and the magnetic materials 30' have the overlap widths each having a width of 17.5 μm on both sides of the magnetosensitive area 23', the area Q is 140×17.5×2=4900 μm$^2$, and the area R is 5600 μm$^2$.

Therefore, the area Q is smaller than the area R. In addition, the area of the magnetosensitive area 23' is 140× 60=8400 μm, and thus, the ratio of the area Q to the magnetosensitive area 23' is about ⅗ (58.3%).

Example 19

A schematic diagram illustrating arrangement of the magnetic material group a19 according to Example 19 is the same as the schematic diagram illustrated in FIGS. 5A and 5B.

Example 19 is obtained by changing the overlap width WP to 40 μm in Example 15.

In Example 19, the area P is 140×40×2=11200 μm$^2$. In addition, since the magnetosensitive area 23' and the magnetic materials 30' have the overlap widths each having a width of 20 μm on both sides of the magnetosensitive area 23', the area Q is 140×20×2=5600 μm$^2$, and the area R is 5600 μm$^2$.

Therefore, the area Q is equal to the area R. In addition, the area of the magnetosensitive area 23' is 140×60=8400 μm$^2$, and thus, the ratio of the area Q to the magnetosensitive area 23' is about ⅔.

Comparative Example 5

A schematic diagram illustrating arrangement of the magnetic material group b5 according to Comparative Example 5 is the same as the schematic diagram illustrated in FIGS. 6A and 6B.

Comparative Example 5 is obtained by arranging the magnetic materials 30L', 30R' and the magnetic material 21' such that the right end of the magnetic material 30L' in the width direction is located on the left side of the left end of the magnetic material 21' in the width direction with an interval of 10 μm, and the left end of the magnetic material 30R' in the width direction is located on the right side of the right end of the magnetic material 21' in the width direction with an interval of 10 μm, in the top view, in Example 11. In other words, the overlap width WP is changed to −10 μm.

In Comparative Example 5, since the magnetic material 21' and the magnetic materials 30' do not have an overlap part, the area P is 0 μm$^2$, the area P is P=Q+R, and thus, all of the areas P, Q, and R are 0 μm$^2$.

Comparative Example 6

A schematic diagram illustrating arrangement of the magnetic material group b6 according to Comparative Example 6 is the same as the schematic diagram illustrated in FIGS. 6A and 6B.

Comparative Example 6 is obtained by changing the overlap width WP to −5 μm in Comparative Example 5.

In Comparative Example 6, the area P is 0 μm$^2$, and all of the areas P, Q, and R are 0 μm$^2$.

Comparative Example 7

A schematic diagram illustrating arrangement of the magnetic material group b7 according to Comparative Example 7 is the same as the schematic diagram illustrated in FIGS. 7A and 7B.

Comparative Example 7 is obtained by arranging the magnetic materials 30L', 30R' and the magnetic material 21' such that the right end of the magnetic material 30L' in the width direction coincides with the left end of the magnetic material 21' in the width direction, and the left end of the magnetic material 30R' in the width direction coincides with the right end of the magnetic material 21' in the width direction, in the top view, in Example 11. In other words, the overlap width WP is changed to 0 μm.

In Comparative Example 7, the area P is 0 μm$^2$, and all of the areas P, Q, and R are 0 μm$^2$.

Example 20

A schematic diagram illustrating arrangement of the magnetic material group a20 according to Example 20 is the same as the schematic diagram illustrated in FIGS. 3A and 3B.

Example 20 is obtained by defining the magnetosensitive area 23' in Example 2 to have the gravity center located at the same position as that of the magnetic material 21' and a size of the length $L_{23}$=140 μm and the width $W_{23}$=80 μm. In addition, the overlap width WP is changed to 5 μm.

In Example 20, the area P is 140×5×2=1400 μm². In addition, since the magnetosensitive area 23' and the magnetic materials 30' do not have an overlap part, the area Q is 0 μm², and the area R is 1400 μm².

Therefore, the area Q is smaller than the area R. In addition, the ratio of the area Q to the magnetosensitive area 23' is "0".

Example 21

A schematic diagram illustrating arrangement of the magnetic material group a21 according to Example 21 is the same as the schematic diagram illustrated in FIGS. 4A and 4B.

Example 21 is obtained by changing the overlap width WP to 10 μm in Example 20.

In Example 21, the area P is 140×10×2=2800 μm². In addition, the area Q is 0 μm², and the area R is 2800 μm².

Therefore, the area Q is smaller than the area R. In addition, the ratio of the area Q to the magnetosensitive area 23' is "0".

Example 22

A schematic diagram illustrating arrangement of the magnetic material group a22 according to Example 22 is the same as the schematic diagram illustrated in FIGS. 5A and 5B.

Example 22 is obtained by changing the overlap width WP to 15 μm in Example 20.

In Example 22, the area P is 140×15×2=4200 μm². In addition, since the magnetosensitive area 23' and the magnetic materials 30' have the overlap widths each having a width of 5 μm, the area Q is 140×5×2=1400 μm², and the area R is 2800 μm.

Therefore, the area Q is smaller than the area R. In addition, the area of the magnetosensitive area 23' is 140×80=11200 μm, and thus, the ratio of the area Q to the magnetosensitive area 23' is about ⅛.

Example 23

A schematic diagram illustrating arrangement of the magnetic material group a23 according to Example 23 is the same as the schematic diagram illustrated in FIGS. 5A and 5B.

Example 23 is obtained by changing the overlap width WP to 20 μm in Example 20.

In Example 23, the area P is 140×20×2=5600 μm². In addition, since the magnetosensitive area 23' and the magnetic materials 30' have the overlap widths each having a width of 10 μm, the area Q is 140×10×2=2800 μm², and the area R is 2800 μm².

Therefore, the area Q is equal to the area R. In addition, the area of the magnetosensitive area 23' is 140×80=11200 μm², and thus, the ratio of the area Q to the magnetosensitive area 23' is about ¼.

Example 24

A schematic diagram illustrating arrangement of the magnetic material group a24 according to Example 24 is the same as the schematic diagram illustrated in FIGS. 5A and 5B.

Example 24 is obtained by changing the overlap width WP to 25 μm in Example 20.

In Example 24, the area P is 140×25×2=7000 μm². In addition, since the magnetosensitive area 23' and the magnetic materials 30' have the overlap widths each having a width of 15 μm on both sides of the magnetosensitive area 23', the area Q is 140×15×2=4200 μm², and the area R is 2800 μm².

Therefore, the area Q is larger than the area R. In addition, the area of the magnetosensitive area 23' is 140×80=11200 μm², and thus, the ratio of the area Q to the magnetosensitive area 23' is about ⅜.

Example 25

A schematic diagram illustrating arrangement of the magnetic material group a25 according to Example 25 is the same as the schematic diagram illustrated in FIGS. 5A and 5B.

Example 25 is obtained by changing the overlap width WP to 30 μm in Example 20.

In Example 25, the area P is 140×30×2=8400 μm². In addition, since the magnetosensitive area 23' and the magnetic materials 30' have the overlap widths each having a width of 20 μm on both sides of the magnetosensitive area 23', the area Q is 140×20×2=5600 μm², and the area R is 2800 μm².

Therefore, the area Q is larger than the area R. In addition, the area of the magnetosensitive area 23' is 140×80=11200 μm, and thus, the ratio of the area Q to the magnetosensitive area 23' is ½.

Comparative Example 8

A schematic diagram illustrating arrangement of the magnetic material group b8 according to Comparative Example 8 is the same as the schematic diagram illustrated in FIGS. 6A and 6B.

Comparative Example 8 is obtained by arranging the magnetic materials 30L', 30R' and the magnetic material 21' such that the right end of the magnetic material 30L' in the width direction is located on the left side of the left end of the magnetic material 21' in the width direction with an interval of 10 μm, and the left end of the magnetic material 30R' in the width direction is located on the right side of the right end of the magnetic material 21' in the width direction with an interval of 10 μm, in the top view, in Example 20. In other words, the overlap width WP is changed to −10 μm.

In Comparative Example 8, since the magnetic material 21' and the magnetic materials 30' do not have an overlap part, the area P is 0 μm², the area P is P=Q+R, and thus, all of the areas P, Q, and R are 0 μm².

Comparative Example 9

A schematic diagram illustrating arrangement of the magnetic material group b9 according to Comparative Example 9 is the same as the schematic diagram illustrated in FIGS. 6A and 6B.

Comparative Example 9 is obtained by changing the overlap width WP to −5 μm in Comparative Example 8.

In Comparative Example 9, the area P is 0 μm², and all of the areas P, Q, and R are 0 μm².

Comparative Example 10

A schematic diagram illustrating arrangement of the magnetic material group b10 according to Comparative Example 10 is the same as the schematic diagram illustrated in FIGS. 7A and 7B.

Comparative Example 10 is obtained by arranging the magnetic materials 30L', 30R' and the magnetic material 21' such that the right end of the magnetic material 30L' in the width direction coincides with the left end of the magnetic material 21' in the width direction, and the left end of the magnetic material 30R' in the width direction coincides with the right end of the magnetic material 21' in the width direction, in the top view, in Comparative Example 8. In other words, the overlap width WP is changed to 0 μm.

In Comparative Example 10, since the magnetic material 21' and the magnetic materials 30' do not have an overlap part, the area P is 0 μm², and all of the areas P, Q, and R are 0 μm².

Comparison of Amplification Factor

The relationship among the width of the magnetosensitive area 23' (referred to as $W_{23}$), the overlap width between the magnetic material 30L' (or the magnetic material 30R') and the magnetic material 21' in the top view (referred to as WP), the areas of P, Q, and R, the ratio of the area Q to the magnetosensitive area 23' (referred to as $Q/S_{23}$), and the average value of the amplification factor in the magnetosensitive area 23' of Example 2 to Example 25 and Comparative Example 2 to Comparative Example 10 is arranged and shown in Table 1.

It is to be noted that, when the magnetic materials 30L', 30R' and the magnetic material 21' do not overlap in the top view and there is a distance between the magnetic material 21' and the magnetic material 30' in the top view, the overlap width WP is represented by a negative value also in Table 1.

TABLE 1

| | $W_{23}$ [um] | WP [um] | P | Q | R | $Q/S_{23}$ [%] | Amplification Factor |
|---|---|---|---|---|---|---|---|
| Comparative Example 2 | 40 | −10 | 0 | 0 | 0 | 0 | 59.3 |
| Comparative Example 3 | | −5 | 0 | 0 | 0 | 0 | 71.7 |
| Comparative Example 4 | | 0 | 0 | 0 | 0 | 0 | 89.4 |
| Example 2 | | 5 | 1400 | 0 | 1400 | 0 | 101.6 |
| Example 3 | | 10 | 2800 | 0 | 2800 | 0 | 109.6 |
| Example 4 | | 15 | 4200 | 0 | 4200 | 0 | 116.2 |
| Example 5 | | 20 | 5600 | 0 | 5600 | 0 | 121.7 |
| Example 6 | | 25 | 7000 | 0 | 7000 | 0 | 125.4 |
| Example 7 | | 30 | 8400 | 0 | 8400 | 0 | 122.8 |
| Example 8 | | 35 | 9800 | 1400 | 8400 | 1/4 | 104.4 |
| Example 9 | | 37.5 | 10500 | 2100 | 8400 | 3/8 | 91.4 |
| Example 10 | | 40 | 11200 | 2800 | 8400 | 1/2 | 76.3 |
| Comparative Example 5 | 60 | −10 | 0 | 0 | 0 | 0 | 58.4 |
| Comparative Example 6 | | −5 | 0 | 0 | 0 | 0 | 70.9 |
| Comparative Example 7 | | 0 | 0 | 0 | 0 | 0 | 88.8 |
| Example 11 | | 2 | 1400 | 0 | 1400 | 0 | 101.0 |
| Example 12 | | 10 | 2800 | 0 | 2800 | 0 | 108.2 |
| Example 13 | | 15 | 4200 | 0 | 4200 | 0 | 113.3 |
| Example 14 | | 20 | 5600 | 0 | 5600 | 0 | 114.0 |
| Example 15 | | 25 | 7000 | 1400 | 5600 | 1/6 | 105.3 |
| Example 16 | | 30 | 8400 | 2800 | 5600 | 1/3 | 91.0 |
| Example 17 | | 35 | 9800 | 4200 | 5600 | 1/2 | 73.5 |
| Example 18 | | 37.5 | 10500 | 4900 | 5600 | 3/5 | 63.6 |
| Example 19 | | 40 | 11200 | 5600 | 5600 | 2/3 | 52.9 |
| Comparative Example 8 | 80 | −10 | 0 | 0 | 0 | 0 | 56.7 |
| Comparative Example 9 | | −5 | 0 | 0 | 0 | 0 | 69.3 |
| Comparative Example 10 | | 0 | 0 | 0 | 0 | 0 | 87.4 |

TABLE 1-continued

| | $W_{23}$ [um] | WP [um] | P | Q | R | $Q/S_{23}$ [%] | Amplification Factor |
|---|---|---|---|---|---|---|---|
| Example 20 | | 5 | 1400 | 0 | 1400 | 0 | 98.8 |
| Example 21 | | 10 | 2800 | 0 | 2800 | 0 | 102.8 |
| Example 22 | | 15 | 4200 | 1400 | 2800 | 1/8 | 99.1 |
| Example 23 | | 20 | 5600 | 2800 | 2800 | 1/4 | 91.2 |
| Example 24 | | 25 | 7000 | 4200 | 2800 | 3/8 | 81.1 |
| Example 25 | | 30 | 8400 | 5600 | 2800 | 1/2 | 69.2 |

Figure 8:
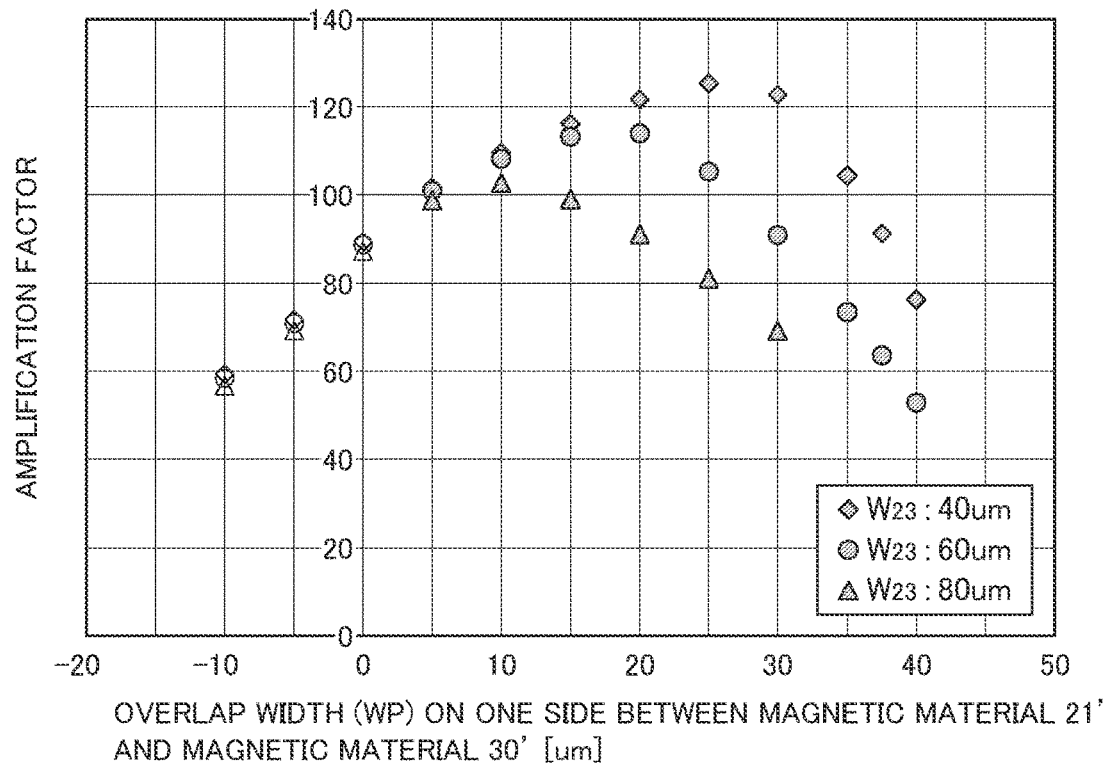
FIG. 8 is an example of a characteristic diagram illustrating a relationship between an overlap width between a magnetic body 30L' and a magnetic body 21' and an average value of an amplification factor of a magnetosensitive area 23'.

FIG. 8 illustrates a relationship between the overlap width WP between the magnetic material 30L' and the magnetic material 21' in the top view, which is put on the horizontal axis, and the average value of the amplification factor of the magnetosensitive area 23', which is put on the vertical axis.

Figure 9:
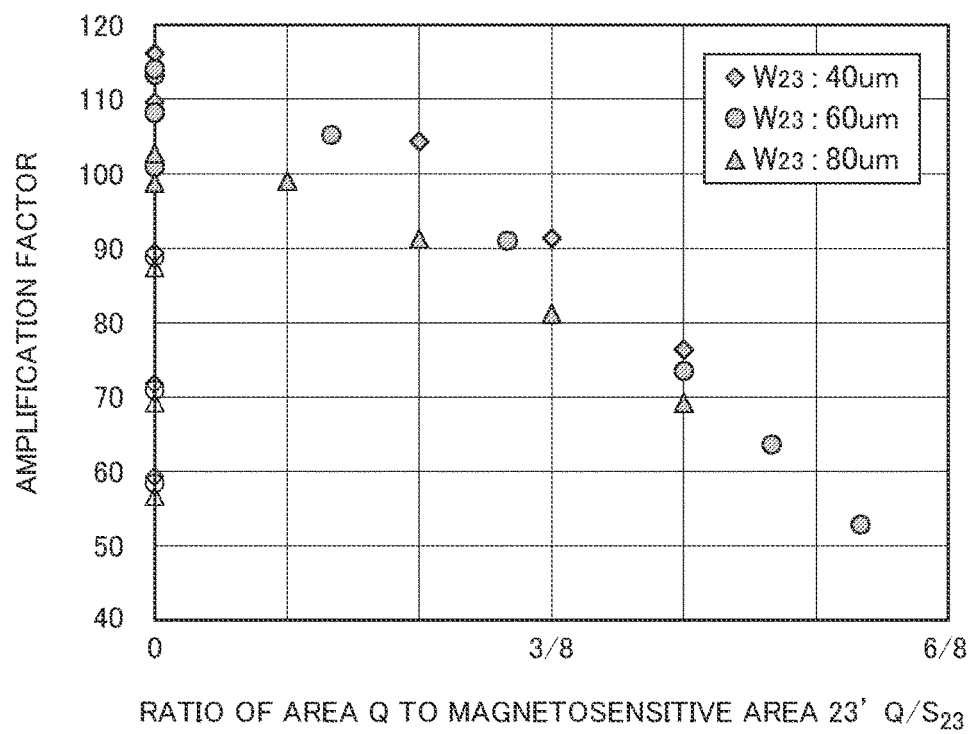
FIG. 9 is an example of a characteristic diagram illustrating a relationship between a ratio of an area Q to the magnetosensitive area 23' and the average value of the amplification factor of the magnetosensitive area 23'.

In addition, FIG. 9 illustrates a relationship between the ratio of the area Q to the magnetosensitive area 23' $Q/S_{23}$, which is put on the horizontal axis, and the average value of the amplification factor of the magnetosensitive area 23', which is put on the vertical axis.

It is to be noted that, in FIG. 8 and FIG. 9, the symbols of the hatched diamond and the blank diamond indicate the case where the width $W_{23}$ of the magnetosensitive area 23' is 40 μm, the symbols of the hatched circle and the blank circle indicate the case where the width $W_{23}$ is 60 μm, and the symbols of the hatched triangle and the blank triangle indicate the case where the width $W_{23}$ is 80 μm. In addition, the symbols of the hatched diamond, circle and triangle indicate Example 2 to Example 25, and the symbols of the blank diamond, circle and triangle indicate Comparative Example 2 to Comparative Example 10.

Here, the difference between Examples and Comparative Examples is only the arrangement position of the magnetic material 30', and thus, it can be understood from Table 1, FIG. 8, and FIG. 9 that the amplification factor is improved, and better sensitivity characteristics can be obtained in many Examples compared to respective Comparative Examples.

In addition, when the width of the overlap part between the free layer 21 and the magnetic flux concentrator 30 is large, the size of the entire magnetic sensor 1 is small. More specifically, it can be said that the magnetic sensor 1 is better than Comparative Examples in terms of capable of reducing the size while maintaining good sensitivity characteristics.

In other words, the magnetic sensor 1 according to one embodiment of the present invention has a smaller size and can obtain better sensitivity characteristics compared to Comparative Examples.

Here, the magnetic material 21' on a virtual space corresponds to the free layer 21. In addition, the magnetic material 30' corresponds to the magnetic flux concentrator 30. The magnetosensitive area 23' corresponds to the pinned layer 23. The areas P, Q, and R respectively correspond to the overlap region P and the overlap parts Q and R.

In other words, it can be understood from the result of Example 2 to Example 25 and Comparative Example 2 to Comparative Example 10 that the magnetic sensor having the overlap region P is better than Comparative Examples.

Furthermore, it can be understood that, in the magnetic sensor having the overlap region P, when the area of the overlap part Q is smaller than the area of the overlap part R, or the ratio of the overlap part Q to the pinned layer in the top view is 3/8 or less, the magnetic sensor can obtain a relatively high amplification factor.

Although the present invention has been described using the embodiments, the technical scope of the present invention is not limited to the scope described in the above embodiments. It is apparent to those skilled in the art that various modifications or improvements can be added to the above embodiments. It is also apparent from the description of the scope of claims that the embodiments to which such modifications or improvements are added can be included in the technical scope of the present invention.

It should be noted that the execution sequence of the respective processes, such as operations and procedures, in the devices and methods illustrated in the scope of claims, specification, and drawings can be performed in any order, unless they are clearly specified by "before", "prior to", and the like, and an output in a prior process is used in a subsequent process. Even when the sequence in the scope of claims, specification, and drawings is described using "first", "next", and the like for convenience, it does not mean that the process needs to be performed in this order.

REFERENCE SIGNS LIST 1, 2 Magnetic sensor
10 Substrate
20 Element part
21 Free layer
21' Magnetic material
22 Non-magnetic layer
23 Pinned layer
23' Magnetosensitive area
30, 30L, 30R Magnetic flux concentrator
30', 30L', 30R' Magnetic material
31 Seed layer
40 Protection layer
40a Opening
41 Protection layer
41a Energization window
50 Wiring part
51 Electrode
a2 to a25 Magnetic material group of Example 2 to Example 25
b2 to b10 Magnetic material group of Comparative Example 2 to Comparative Example 10

The invention claimed is:

1. A magnetic sensor comprising:
a substrate;
an element part in which a free layer, a non-magnetic layer, and a pinned layer are stacked on the substrate; and
a magnetic flux concentrator,
wherein
an area of the free layer is larger than an area of the pinned layer in a top view, and
the free layer and the magnetic flux concentrator have a first overlap region in which the free layer and the magnetic flux concentrator at least partially overlap in the top view.

2. The magnetic sensor according to claim 1, wherein, in the element part, the free layer, the non-magnetic layer, and the pinned layer are stacked on the substrate in this order.

3. The magnetic sensor according to claim 1, wherein the magnetic flux concentrator is electrically insulated from the element part.

4. The magnetic sensor according to claim 1, wherein at least a part of the pinned layer and at least a part of the magnetic flux concentrator do not overlap in the top view.

5. The magnetic sensor according to claim 1, wherein an area of a second overlap region in which the first overlap region and a part of the pinned layer overlap in the top view is smaller than an area obtained by subtracting the area of the second overlap region from an area of the first overlap region.

6. The magnetic sensor according to claim 1, wherein the area of a second overlap region in which the first overlap region and a part of the pinned layer overlap in the top view is ⅜ or less of the area of the pinned layer.

7. The magnetic sensor according to claim 1, wherein the pinned layer and the magnetic flux concentrator do not overlap in the top view.

8. The magnetic sensor according to claim 1, wherein
the magnetic flux concentrator has a rectangular shape in the top view,
the element part has a magnetosensitive axis, and
the element part is arranged along a side substantially perpendicular to a direction of the magnetosensitive axis among respective sides of the magnetic flux concentrator.

9. The magnetic sensor according to claim 1, comprising two magnetic flux concentrators each of which serves as the magnetic flux concentrator,
wherein the element part is arranged to be sandwiched between the two magnetic flux concentrators in the top view.

10. The magnetic sensor according to claim 1, comprising a plurality of element parts each of which serves as the element part,
wherein
each of the plurality of the element parts includes a plurality of pinned layers each of which serves as the pinned layer, and
the plurality of element parts are electrically connected in series.

11. The magnetic sensor according to claim 10, wherein
the element part has a magnetosensitive axis, and
the plurality of the element parts are arranged side by side in a direction substantially perpendicular to the direction of the magnetosensitive axis in the top view.

12. The magnetic sensor according to claim 1, wherein
the element part has a magnetosensitive axis, and
a length of the element part in a direction perpendicular to the direction of the magnetosensitive axis is shorter than a length of the magnetic flux concentrator in the direction perpendicular to the direction of the magnetosensitive axis in the top view.

13. The magnetic sensor according to claim 1, wherein
the element part has a predetermined magnetosensitive axis, and
at least a part of the pinned layer is arranged on a line segment through a gravity center of the free layer and perpendicular to the direction of the magnetosensitive axis in the top view.

14. The magnetic sensor according to claim 1, wherein a thickness of the magnetic flux concentrator is larger than a thickness of the element part.

15. The magnetic sensor according to claim 1, wherein the magnetic flux concentrator and the element part are arranged such that a top surface of the free layer is lower than a lower surface of the magnetic flux concentrator in a side view.

16. The magnetic sensor according to claim 1, wherein
the element part has a magnetosensitive axis, and
a length of the magnetic flux concentrator in a direction substantially parallel to the magnetosensitive axis is longer than a length of the magnetic flux concentrator in a direction substantially perpendicular to the magnetosensitive axis by two or more times in the top view.

17. The magnetic sensor according to claim 1, wherein the magnetic flux concentrator includes a first soft magnetic material formed on the substrate and a second soft magnetic material formed separately from the first soft magnetic material.

18. The magnetic sensor according to claim 1, wherein at least a part of the magnetic flux concentrator includes a plating layer.

19. The magnetic sensor according to claim 1, wherein
- the free layer is formed by stacking a first ferromagnetic layer, a first magnetic coupling layer, and a second ferromagnetic layer in this order,
- the pinned layer is formed by stacking a third ferromagnetic layer, a second magnetic coupling layer, a fourth ferromagnetic layer, and a first antiferromagnetic layer in this order,
- the first and second magnetic coupling layer is formed of a conductive and non-magnetic material,
- thicknesses of the first and second magnetic coupling layer is smaller than a thickness of any one of the first to fourth ferromagnetic layer, and
- the second ferromagnetic layer and the third ferromagnetic layer contain at least Co and Fe.

20. The magnetic sensor according to claim 19, wherein a thickness of the first ferromagnetic layer is larger than a sum of thicknesses of the second to fourth ferromagnetic layer.

\* \* \* \* \*